United States Patent
Miyoshi

(10) Patent No.: US 9,761,784 B2
(45) Date of Patent: Sep. 12, 2017

(54) ELECTROACOUSTIC CONVERTER FILM, FLEXIBLE DISPLAY, VOCAL CORD MICROPHONE, AND MUSICAL INSTRUMENT SENSOR

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

(*) Notice: Subject to any disclaimer, the term of this patent is extended or adjusted under 35 U.S.C. 154(b) by 753 days.

(21) Appl. No.: 14/229,606

(22) Filed: Mar. 28, 2014

(65) Prior Publication Data

US 2014/0210309 A1    Jul. 31, 2014

Related U.S. Application Data

(63) Continuation of application No. PCT/JP2012/075392, filed on Oct. 1, 2012.

(30) Foreign Application Priority Data

Sep. 30, 2011  (JP) .................................. 2011-218499
Jun. 7, 2012  (JP) .................................. 2012-129965

(51) Int. Cl.
  *H01L 41/04*  (2006.01)
  *H01L 41/18*  (2006.01)
  (Continued)

(52) U.S. Cl.
  CPC ......... *H01L 41/0805* (2013.01); *G10H 3/143* (2013.01); *G10H 3/146* (2013.01);
  (Continued)

(58) Field of Classification Search
  CPC . H01L 41/0805; H01L 41/45; H01L 41/1132; H01L 41/193; G10H 3/143;
  (Continued)

(56) References Cited

U.S. PATENT DOCUMENTS 4,406,323 A  *  9/1983  Edelman ................. F28F 13/16
                                                            165/109.1
4,407,054 A  *  10/1983  Zipfel, Jr. .............. C08G 18/10
                                                            252/62.9 R
(Continued)

FOREIGN PATENT DOCUMENTS

CN          1879230 A       12/2006
JP          61-191698 U     11/1986
(Continued)

OTHER PUBLICATIONS

Translations of the International Preliminary Report on Patentability and Written Opinioin of the International Searching Authority (Forms PCT/IB/338, PCT/IB/373 and PCT/ISA/237), dated Apr. 10, 2014, for International Application No. PCT/JP2012/075392.
(Continued)

*Primary Examiner* — Thomas Dougherty
(74) *Attorney, Agent, or Firm* — Birch, Stewart, Kolasch & Birch, LLP

(57) ABSTRACT

Provided is an electroacoustic converter film including: a polymeric composite piezoelectric body having piezoelectric particles dispersed in a viscoelastic matrix which is formed of a polymer material exhibiting viscoelasticity at ordinary temperatures; thin film electrodes formed on both sides of the polymeric composite piezoelectric body; and protective layers formed on surfaces of the thin film electrodes. The electroacoustic converter film serves as a speaker capable of being integrated with a flexible display without impairing lightweightness or flexibility, and has considerable frequency dispersion in the storage modulus and also has a local maximum of the loss tangent around ordinary temperatures. A flexible display, a vocal cord microphone and a musical instrument sensor, in each of which the electroacoustic converter film is used, are also provided.

19 Claims, 19 Drawing Sheets

(51) Int. Cl.
*H01L 41/08* (2006.01)
*H04R 7/04* (2006.01)
*H04R 17/00* (2006.01)
*G10H 3/14* (2006.01)
*H04R 31/00* (2006.01)
*H04R 1/46* (2006.01)
*G02F 1/1333* (2006.01)

(52) U.S. Cl.
CPC ............ H04R 7/04 (2013.01); H04R 17/005 (2013.01); *G02F 2001/133394* (2013.01); *G10H 2220/531* (2013.01); *G10H 2220/545* (2013.01); *G10H 2220/551* (2013.01); *H04R 1/46* (2013.01); *H04R 31/003* (2013.01); *H04R 2307/025* (2013.01); *H04R 2499/15* (2013.01)

(58) Field of Classification Search
CPC ........ G10H 3/146; H04R 7/04; H04R 17/005; B06B 1/0688
USPC .................................................. 310/328, 800
See application file for complete search history.

(56) References Cited

U.S. PATENT DOCUMENTS

| | | | | |
|---|---|---|---|---|
| 5,374,449 | A | * | 12/1994 | Buhlmann .......... H01L 41/1132 101/129 |
| 2002/0173573 | A1 | * | 11/2002 | Borchers ................ B29C 70/58 524/413 |
| 2004/0061543 | A1 | | 4/2004 | Nam et al. |
| 2007/0186689 | A1 | * | 8/2007 | Fukuda ..................... G01L 1/16 73/862.68 |
| 2011/0074249 | A1 | | 3/2011 | Sakashita et al. |
| 2011/0233451 | A1 | * | 9/2011 | Kurbanov ............. H01L 41/183 252/62.9 PZ |
| 2011/0281172 | A1 | * | 11/2011 | Yong ..................... H01M 2/166 429/301 |
| 2012/0154503 | A1 | * | 6/2012 | Daniel ..................... H02N 2/18 347/110 |

FOREIGN PATENT DOCUMENTS

| | | | | |
|---|---|---|---|---|
| JP | 11-135855 | A | 5/1999 | |
| JP | 2000-338901 | A | 12/2000 | |
| JP | 2005-298704 | A | 10/2005 | |
| JP | 2008-112856 | A | 5/2008 | |
| JP | 2008-151638 | A | * 7/2008 | .............. G01L 1/16 |
| JP | 2008-294493 | A | 12/2008 | |
| JP | 2008-304558 | A | 12/2008 | |
| JP | 2011-91371 | A | 5/2011 | |
| JP | 2012-34197 | A | 2/2012 | |
| JP | WO-2016/017632 | A1 | * 2/2016 | .............. H04R 7/14 |
| KR | 10-2004-0026756 | A | 4/2004 | |

OTHER PUBLICATIONS

Kitayama, "366 Piezoelectric characteristics of polymer-ceramic composite," 1971 General National Conference of the Institute of Electronics, Information and Communication Engineers, 1971, pp. 368 (5 pages total with English translation).

Shirai et al., "A Microphone for telephone using composite piezoelectric polymer," The Institute of Electronics, Information and Communication Engineers, Jul. 29, 1980, pp. 15-22 (14 pages total with English translation).

Korean Office Action and partial English translation thereof, dated Apr. 20, 2015, for Korean Application No. 10-2014-7008456.

International Search Report, issued in PCT/JP2012/075392, dated, Nov. 13, 2012.

Korean Office Action, dated Oct. 8, 2015, for Korean Application No. 10-2014-7008456, with a partial English translation.

Chinese Office Action and Search Report dated Feb. 26, 2016, for Chinese Application No. 201280047645.X with the partial English translation.

* cited by examiner

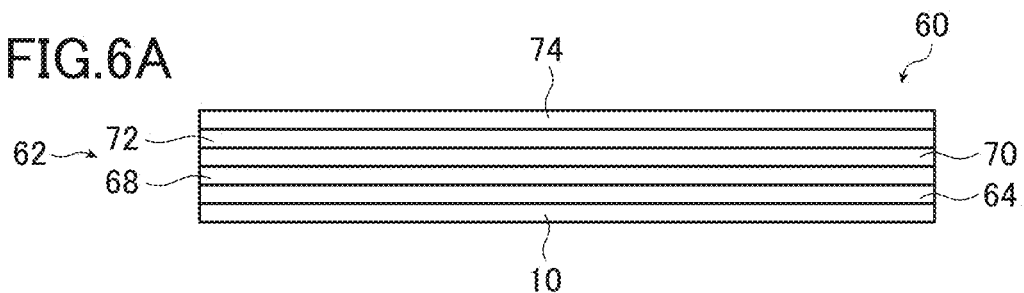
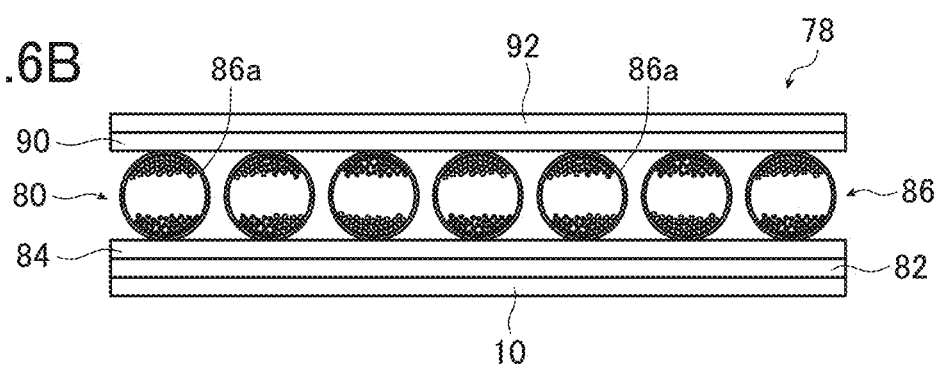
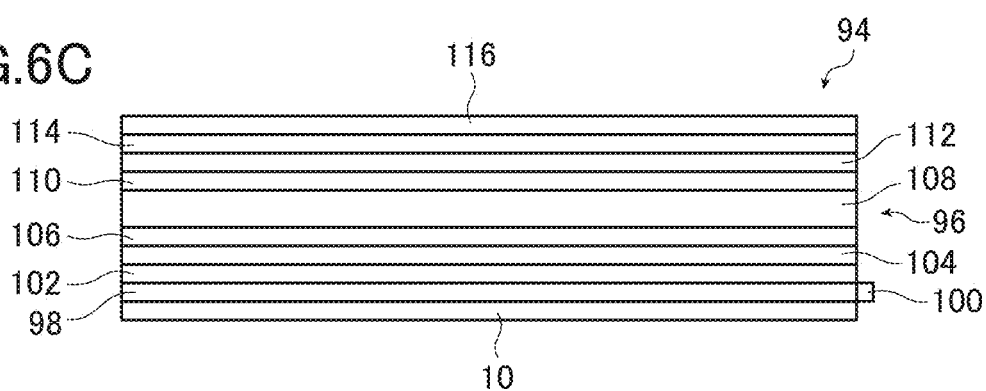

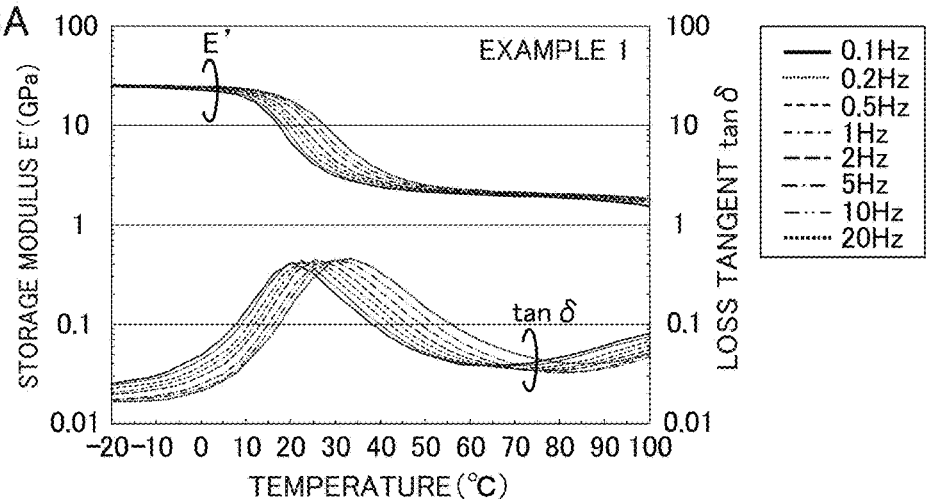
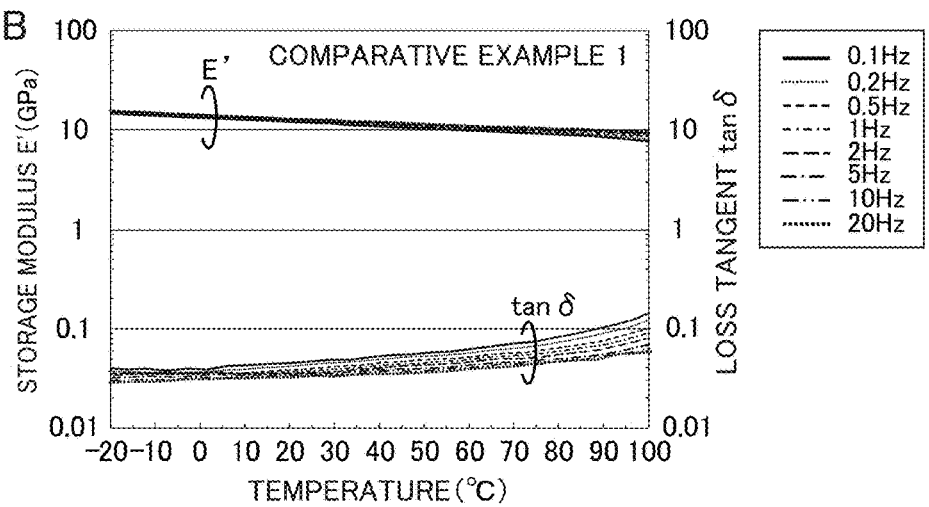
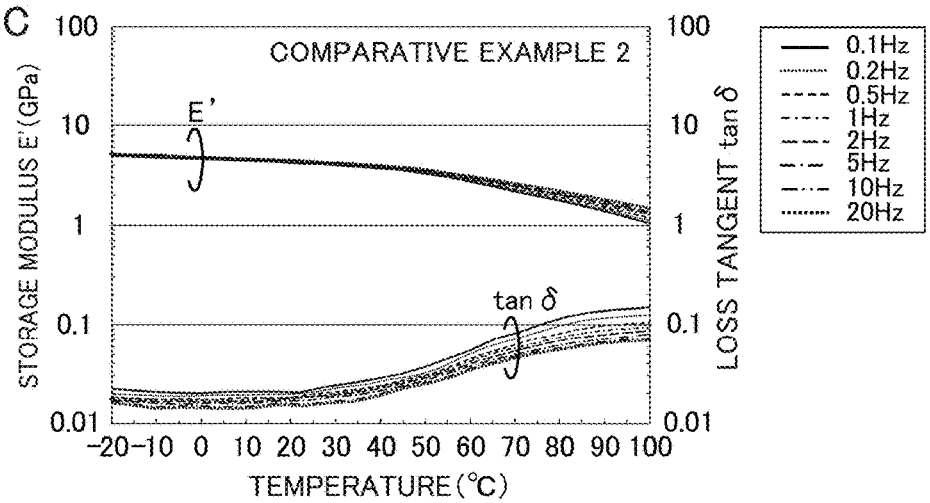

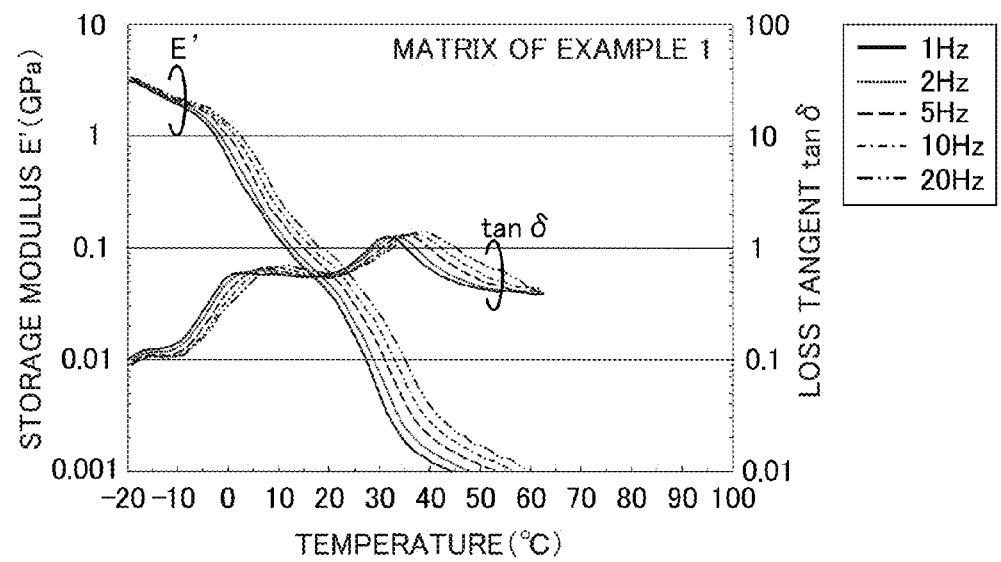
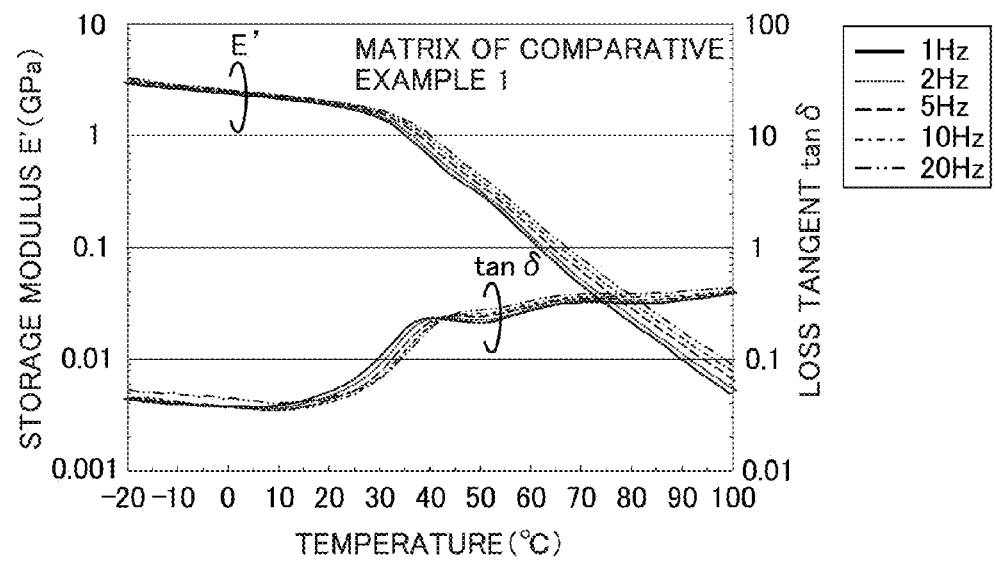

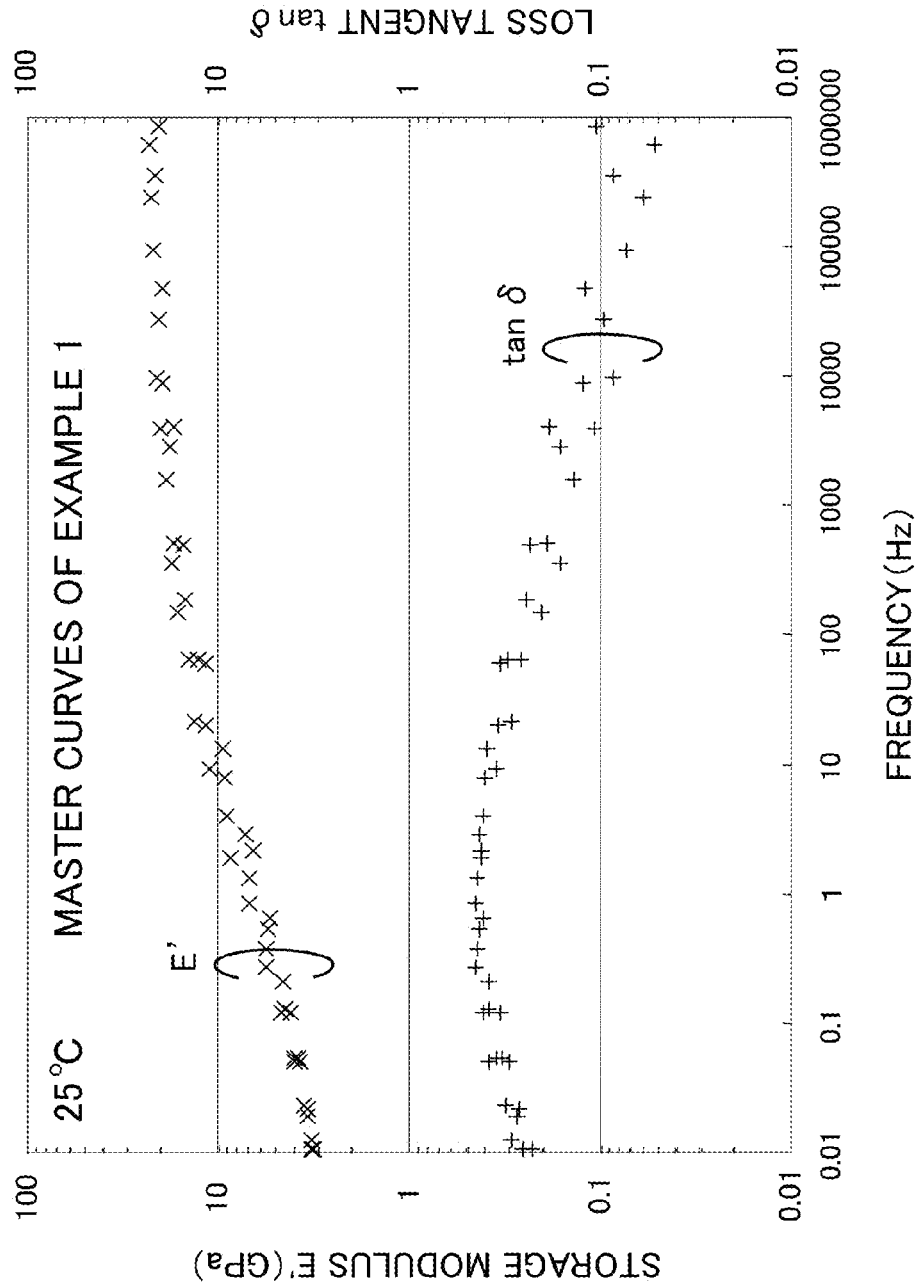

ELECTROACOUSTIC CONVERTER FILM, FLEXIBLE DISPLAY, VOCAL CORD MICROPHONE, AND MUSICAL INSTRUMENT SENSOR

CROSS REFERENCE TO RELATED APPLICATIONS

This application is a continuation application of International Application PCT/JP2012/075392 filed on Oct. 1, 2012, which claims priority under 35 U.S.C. 119(a) to Application No. 2011-218499 filed in Japan on Sep. 30, 2011 and Application No. 2012-129965 filed in Japan on Jun. 7, 2012, all of which are hereby expressly incorporated by reference into the present application.

BACKGROUND OF THE INVENTION

The present invention relates to an electroacoustic converter film used for acoustic devices such as speakers or microphones. More specifically, the present invention relates to an electroacoustic converter film which has excellent flexibility and acoustic characteristics, can stably output sound even if deformed, and makes it possible to realize a flexible speaker or the like suitably usable for a flexible display or the like. The present invention also relates to a flexible display, a vocal cord microphone and a musical instrument sensor in each of which such an electroacoustic converter film is used.

In recent years, the research related to flexible displays using a flexible substrate such as a plastic one has been progressing.

As a substrate of such flexible displays, for example, JP 2000-338901 A discloses a flexible display substrate obtained by laminating a gas barrier layer or a transparent conductive layer on a transparent plastic film.

The flexible displays are superior to the conventional displays using a glass substrate in terms of the lightweightness, slimness, flexibility, and the like, and can be placed on a curved surface of a column and the like. Moreover, since flexible displays can be stored in a rolled state, portability thereof does not deteriorate even if the screen size thereof is large. Therefore, flexible displays are drawing attention for usage in apparatuses for displaying advertisement and the like or as a display unit for personal digital assistant (PDA) devices.

When these flexible displays are used as an image display apparatus-cum-sound generation apparatus such as a television receiver that reproduces sound along with images, a speaker which is an acoustic apparatus generating sound is required.

Regarding the shape of conventional speakers, generally, there are so-called cone-type speakers having a funnel shape, dome-type speakers having a spherical shape, and the like. However, if these speakers are built in the aforementioned flexible displays, lightweightness or flexibility which is an advantage of the flexible displays may be impaired. Moreover, if the speakers are installed externally, it is inconvenient to carry the speakers, it is difficult to install the displays to a curved wall, and the external appearance may not be aesthetically pleasing.

Under these circumstances, for example, JP 2008-294493 A discloses that as a speaker, which can be integrated with a flexible display without impairing the lightweightness or flexibility, a sheet-like piezoelectric film having flexibility can be adopted.

The piezoelectric film is obtained by performing polarization processing on a uniaxially stretched poly vinylidene fluoride (PVDF) film at a high voltage, and has a property of expanding and contracting in response to an applied voltage.

In order to adopt the piezoelectric film as a speaker, the expansion and contraction movement performed along the film surface needs to be converted into vibration of the film surface. The expansion and contraction movement can be converted into vibration by holding the piezoelectric film in a curved state, and in this manner, the piezoelectric film can be caused to function as a speaker.

Incidentally, it is well known that the lowest resonance frequency $f_0$ of a speaker diaphragm is calculated by the following equation. In the equation, s is the stiffness of a vibration system, and m is the mass.

Lowest resonance frequency:

$$f_0 = \frac{1}{2\pi}\sqrt{\frac{s}{m}}$$

At this time, as the degree of bending of the piezoelectric film increases, that is, as a radius of curvature of a bending portion increases, the mechanical stiffness s decreases, hence the lowest resonance frequency $f_0$ is reduced. That is, the sound quality (volume and frequency characteristics) of the speaker varies with the radius of curvature of the piezoelectric film.

In order to solve the above problem, in JP 2008-294493 A, the speaker has a sensor for measuring the degree of bending of the piezoelectric film, and according to the degree of bending of the piezoelectric film, sound quality is corrected by means of increasing or decreasing the amplitude by a predetermined amount for each frequency band of the audio signals, whereby stabilized sound can be output.

When a flexible display, which is integrated with a speaker formed of a piezoelectric film and has a rectangular shape in a plan view, is gripped in a gently bent manner just like documents such as a newspaper or a magazine as a portable apparatus and used by changing its screen display between portrait and landscape modes, it is preferable that the image display surface is bendable not only in the longitudinal direction but the lateral direction.

However, since the piezoelectric film formed of uniaxially stretched PVDF has in-plane anisotropy in its piezoelectric characteristics, the sound quality varies significantly with the bending direction even if the curvature is the same.

In addition, since the loss tangent of PVDF is smaller than that of the ordinary speaker diaphragm such as cone paper, resonance thereof easily becomes strong, and frequency characteristics thereof show great fluctuation of frequency. Accordingly, when the lowest resonance frequency $f_0$ varies with the change in the curvature, the sound quality also changes to a large extent.

As described above, due to the problems intrinsic to PVDF, it is difficult for the sound quality correction means disclosed in JP 2008-294493 A described above to reproduce stabilized sound.

Meanwhile, as an example of sheet-like flexible piezoelectric materials which do not have in-plane anisotropy in their piezoelectric characteristics, there is a polymeric composite piezoelectric body obtained by dispersing a piezoelectric ceramic in a polymer matrix.

In the polymeric composite piezoelectric body, the piezoelectric ceramic is hard while the polymer matrix is soft.

Therefore, there is a possibility that energy may be absorbed before vibration of the piezoelectric ceramic is transmitted over the entire piezoelectric body. This is called the transmission efficiency of mechanical vibration energy. In order to improve the transmission efficiency, the polymeric composite piezoelectric body needs to be hardened, and for doing this, the volume fraction of the piezoelectric ceramic added to the matrix needs to be at least 40% to 50% or higher.

For example, it is disclosed by Toyoki KITAYAMA in Lectures and Articles, Showa 46th Year General National Conference of the Institute of Electronics, Information and Communication Engineers, 366 (1971) that a polymeric composite piezoelectric body, which is obtained by mixing powder of PZT ceramic as a piezoelectric with PVDF by means of solvent casting or hot kneading, establishes both pliableness of PVDF and outstanding piezoelectric characteristics of PZT ceramic to some extent.

However, if the proportion of the PZT ceramic is increased to improve the piezoelectric characteristics, that is, the transmission efficiency, this results in a mechanical defect that the piezoelectric body becomes hard and brittle.

In order to solve such a problem, for example, Seiichi SHIRAI, Hiroaki NOMURA, Juro OHGA, Takeshi YAMADA and Nobuki OHGUCHI disclose an attempt at maintaining flexibility by adding fluororubber to PVDF in Technical Research Report of the Institute of Electronics, Information and Communication Engineers, 24, 15 (1980).

From the viewpoint of flexibility, this method produces a certain effect. However, generally, rubber has a Young's modulus of 1 to 10 MPa which is an extremely small value. Therefore, the addition of the rubber decreases the hardness of the polymeric composite piezoelectric body, and as a result, the transmission efficiency of vibration energy also decreases.

As described above, when the conventional polymeric composite piezoelectric body is used as a speaker diaphragm, if an attempt at imparting flexibility to the piezoelectric body is made, the energy efficiency unavoidably decreases. Therefore, the conventional polymeric composite piezoelectric body cannot produce a sufficient performance as a speaker for a flexible display.

SUMMARY OF THE INVENTION

From the above, it is preferable that the polymeric composite piezoelectric body used as a speaker for flexible displays satisfies the following requirements.

(i) Flexibility

For example, when a flexible display is gripped in a gently bent manner just like documents such as a newspaper or a magazine as a portable apparatus, the display constantly and externally experiences severe bending deformation which is caused relatively slow at a frequency of several Hz or lower. At this time, if the polymeric composite piezoelectric body is hard, great bending stress is caused accordingly. Consequently, cracks may occur at the interface between the polymer matrix and the piezoelectric particles, leading to breakage. Therefore, the polymeric composite piezoelectric body is required to have an appropriate degree of softness. If the strain energy can be diffused outside in the form of heat, the stress can be relaxed. Accordingly, the polymeric composite piezoelectric body is required to have the loss tangent which is appropriately great.

(ii) Sound Quality

In a speaker, piezoelectric particles are vibrated at a frequency within an audible frequency band from 20 Hz to 20 kHz to generate vibration energy, which causes the entire diaphragm (polymeric composite piezoelectric body) to be integrally vibrated and thereby reproduce sound. Therefore, in order to increase the transmission efficiency of the vibration energy, the polymeric composite piezoelectric body is required to have an appropriate degree of hardness. If the speaker has smooth frequency characteristics, when the lowest resonance frequency $f_0$ varies with the change in curvature, the sound quality only changes to a small extent. Consequently, the loss tangent of the polymeric composite piezoelectric body needs to be great appropriately.

To summarize, the polymeric composite piezoelectric body used as a speaker for flexible displays is required to exhibit hardness with respect to vibration at 20 Hz to 20 kHz while exhibiting softness with respect to vibration at a frequency of several Hz or lower. Furthermore, the loss tangent of the polymeric composite piezoelectric body is required to be appropriately great with respect to vibration at any frequency not higher than 20 kHz.

The present invention has been made to solve the above problems, and aims to provide an electroacoustic converter film formed of a polymeric composite piezoelectric body, which film serves as a speaker capable of being integrated with a flexible display without impairing lightweightness or flexibility, and has considerable frequency dispersion in the storage modulus (E') and also has a local maximum of the loss tangent (tan δ) around ordinary temperatures. The present invention also aims to provide a flexible display, a vocal cord microphone and a musical instrument sensor in each of which such an electroacoustic converter film is used.

In order to solve the above problems, the present inventor focused on a viscoelastic material which has considerable frequency dispersion in the storage modulus E' and also has a local maximum of the loss tangent tan δ around ordinary temperatures, and conducted thorough examination to apply this material to a matrix material.

As a result, the inventor has devised an electroacoustic converter film formed of a polymeric composite piezoelectric body which exhibits hardness with respect to vibration at 20 Hz to 20 kHz while exhibiting softness with respect to vibration at a frequency of several Hz or lower, and has an appropriate loss tangent with respect to vibration at any frequency not higher than 20 kHz.

In other words, the present invention provides an electroacoustic converter film comprising: a polymeric composite piezoelectric body having piezoelectric particles dispersed in a viscoelastic matrix which is formed of a polymer material exhibiting viscoelasticity at ordinary temperatures; thin film electrodes formed on both sides of the polymeric composite piezoelectric body; and protective layers formed on surfaces of the thin film electrodes.

In the electroacoustic converter film of the invention as such, it is preferable that a loss tangent (tan δ) at a frequency of 1 Hz obtained by dynamic viscoelasticity measurement of the electroacoustic converter film has a local maximum of 0.1 or more within a temperature range of 0° C. to 50° C.

A storage modulus (E') at a frequency of 1 Hz obtained by dynamic viscoelasticity measurement of the electroacoustic converter film is preferably 10 to 30 GPa at 0° C. and 1 to 10 GPa at 50° C.

It is preferable that a product of a thickness of the electroacoustic converter film and a storage modulus (E') at a frequency of 1 Hz obtained by dynamic viscoelasticity measurement of the electroacoustic converter film is $1.0 \times 10^6$ N/m to $2.0 \times 10^6$ N/m at 0° C. and $1.0 \times 10^5$ N/m to $1.0 \times 10^6$ N/m at 50° C.

On a master curve obtained from dynamic viscoelasticity measurement of the electroacoustic converter film, a loss tangent (tan δ) at 25° C. and at a frequency of 1 kHz is preferably 0.05 or more.

The polymer material preferably has a glass transition temperature of 0° C. to 50° C. at a frequency of 1 Hz.

It is preferable that a loss tangent (tan δ) at a frequency of 1 Hz obtained by dynamic viscoelasticity measurement of the polymer material has a local maximum of 0.5 or more within a temperature range of 0° C. to 50° C.

A storage modulus (E') at a frequency of 1 Hz obtained by dynamic viscoelasticity measurement of the polymer material is preferably 100 MPa or higher at 0° C. and 10 MPa or lower at 50° C.

The polymer material preferably has a relative dielectric constant of 10 or more at 25° C.

It is preferable that the polymer material has a cyanoethyl group.

Preferably, the polymer material is cyanoethylated polyvinyl alcohol.

It is preferably that the piezoelectric particles are present in the polymeric composite piezoelectric body at a volume fraction of 50% or higher.

The piezoelectric particles are preferably ceramic particles having a perovskite crystal structure or a wurtzite crystal structure.

The ceramic particles are preferably particles of lead zirconate titanate, lead lanthanate zirconate titanate, barium titanate, zinc oxide, or a solid solution of barium titanate and bismuth ferrite.

It is preferable that the protective layers have a thickness at most two times as large as a thickness of the polymeric composite piezoelectric body.

It is preferable that a product of a thickness and a Young's modulus of the thin film electrodes is smaller than a product of a thickness and a Young's modulus of the protective layers.

The protective layers are preferably formed of polyethylene terephthalate, polypropylene, polystyrene, polycarbonate, polyphenylene sulfite, polymethyl methacrylate, polyetherimide, polyimide, polyethylene naphthalate, or a cyclic olefin resin.

The thin film electrodes are preferably formed of copper, aluminum, gold, silver, platinum, or indium tin oxide.

The present invention also provides a flexible display comprising the electroacoustic converter film of the invention that is attached to the flexible display exhibiting flexibility on a side opposite with a side where an image display surface is located.

The present invention further provides a vocal cord microphone which uses the electroacoustic converter film of the invention as a sensor.

Apart from the above, the present invention provides a musical instrument sensor which uses the electroacoustic converter film of the invention as a sensor.

The electroacoustic converter film of the present invention comprises a polymeric composite piezoelectric body obtained by dispersing piezoelectric particles in a viscoelastic matrix formed of a polymer material exhibiting viscoelasticity at ordinary temperatures, thin film electrodes formed on both sides of the polymeric composite piezoelectric body, and protective layers formed on the surfaces of the thin film electrodes, and, as such, it has considerable frequency dispersion in the elastic modulus, can exhibit hardness with respect to vibration at 20 Hz to 20 kHz while exhibiting softness with respect to vibration at a frequency of several Hz or lower, and has an appropriate loss tangent with respect to vibration at any frequency not higher than 20 kHz.

Therefore, according to the electroacoustic converter film of the present invention, it is possible to realize an electroacoustic converter film, which can realize a flexible speaker and the like having excellent flexibility and acoustic characteristics, being able to output sound stably even if deformed, and being suitably usable for a flexible display and the like, and to realize a flexible speaker which can be integrated with a flexible display without impairing lightweightness or flexibility.

Moreover, the flexible display of the present invention that is obtained by attaching the electroacoustic converter film of the present invention to a flexible display having flexibility (image display device having flexibility) has excellent flexibility and can stably output sound regardless of the bending direction or the degree of bending that depends on the manner of gripping the display by hand or the place where the display is used.

Furthermore, the vocal cord microphone and the musical instrument sensor of the present invention in each of which the electroacoustic converter film of the present invention is used as a sensor have excellent flexibility, have small and simple configurations, and can stably reproduce voice and sound of musical instruments with high fidelity regardless of the bending direction or the degree of bending that depends on the place where the vocal cord microphone or the musical instrument sensor is used, and the like.

BRIEF DESCRIPTION OF THE DRAWINGS

FIG. 6A is a diagram schematically showing an organic EL display as the flexible display of the present invention; FIG. 6B is a diagram schematically showing electronic paper as the flexible display of the present invention; and FIG. 6C is a diagram schematically showing a liquid crystal display as the flexible display of the present invention.

FIGS. 8A to 8C are diagrams illustrating temperature dependence of dynamic viscoelasticity of the electroacoustic converter film of the present invention and comparative materials.

FIGS. 9A and 9B are diagrams illustrating temperature dependence of dynamic viscoelasticity of the polymer materials alone which were used for matrices of the electroacoustic converter film of the present invention and a comparative material.

FIG. 17 is a diagram showing master curves obtained by measuring dynamic viscoelasticity of the electroacoustic converter film of the present invention.

DETAILED DESCRIPTION OF THE INVENTION

Hereinafter, the electroacoustic converter film, the flexible display, the vocal cord microphone, and the musical instrument sensor of the present invention will be described in detail based on preferable examples illustrated in the attached drawings.

Figure 1:
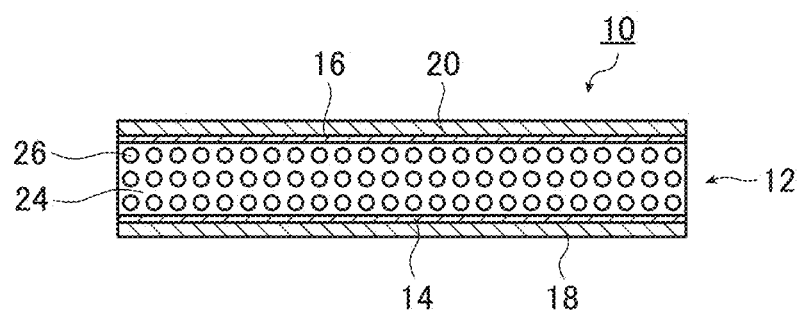
FIG. 1 is a schematic view illustrating an example of the electroacoustic converter film of the present invention.

FIG. 1 schematically illustrates an example of the electroacoustic converter film of the present invention.

An electroacoustic converter film 10 (hereinafter referred to as "converter film 10") shown in FIG. 1 is basically configured with a piezoelectric body layer 12 that is formed of a polymeric composite piezoelectric body, a thin film electrode 14 that is disposed on one side of the piezoelectric body layer 12, a thin film electrode 16 that is disposed on the other side of the piezoelectric body layer 12, a protective layer 18 that is disposed on the surface of the thin film electrode 14, and a protective layer 20 that is disposed on the surface of the thin film electrode 16.

The converter film 10 is used in speakers, microphones, and various acoustic devices (acoustic instruments) such as a pickup used for musical instruments including a guitar, for generating (reproducing) sound caused by vibration occurring in response to electric signals, and for converting the vibration caused by sound into electric signals.

As described above, the piezoelectric body layer 12 in the converter film 10 of the present invention is formed of the polymeric composite piezoelectric body.

In the present invention, the polymeric composite piezoelectric body forming the piezoelectric body layer 12 is obtained by uniformly dispersing piezoelectric particles 26 in a viscoelastic matrix 24 formed of a polymer material that exhibits viscoelasticity at ordinary temperatures. Preferably, the piezoelectric body layer 12 undergoes polarization processing.

It should be noted that in the present specification, the term "ordinary temperatures" refers to temperatures within the range from about 0° C. to about 50° C.

Generally, polymer solids have a viscoelasticity relaxation mechanism. Along with the temperature rise or reduction in frequency, molecular motion on a large scale is observed as a decrease in storage modulus (Young's modulus) (relaxation) or as a local maximum of the loss modulus (absorption). Particularly, the relaxation resulting from micro-Brownian motion of a molecular chain in an amorphous region is called primary dispersion and observed as an extremely large degree of relaxation. The temperature at which the primary dispersion occurs is referred to as the glass transition point (Tg), and the viscoelasticity relaxation mechanism most markedly functions at this temperature.

In the present invention, a polymer material having the glass transition point at an ordinary temperature, that is, a polymer material exhibiting viscoelasticity at ordinary temperatures is used as a matrix of the polymeric composite piezoelectric body (piezoelectric body layer 12), whereby a polymeric composite piezoelectric body that exhibits hardness with respect to vibration at 20 Hz to 20 kHz while exhibiting softness with respect to slow vibration at a frequency of several Hz or lower is realized. From the viewpoint of desirably causing the polymeric composite piezoelectric body to behave as above, it is especially preferable to use the polymer material, whose glass transition temperature at a frequency of 1 Hz is an ordinary temperature, as a matrix of the polymeric composite piezoelectric body.

As the polymer material exhibiting viscoelasticity at ordinary temperatures, various known materials can be used. Preferably used is the polymer material whose loss tangent tan δ at a frequency of 1 Hz obtained by dynamic viscoelasticity testing has a local maximum of 0.5 or more at an ordinary temperature.

If such a material is used, when the polymeric composite piezoelectric body is gently bent by the external force, stress concentration at a polymer matrix-piezoelectric particle interface in a portion where the bending moment becomes maximum is relaxed and, accordingly, a high flexibility is expected.

Moreover, the storage modulus (E') at a frequency of 1 Hz of the polymer material that is obtained by dynamic viscoelasticity measurement is preferably 100 MPa or higher at 0° C. and 10 MPa or lower at 50° C.

If the polymer material has the above property, the bending moment caused when the polymeric composite piezoelectric body is gently bent by the external force can be reduced, and the polymeric composite piezoelectric body can exhibit hardness with respect to acoustic vibration at 20 Hz to 20 kHz.

It is more preferable that the polymer material has a relative dielectric constant of 10 or more at 25° C.

If the polymer material has the above property, when voltage is applied to the polymeric composite piezoelectric body, a higher electric field is applied to the piezoelectric particles in the polymer matrix, hence a larger degree of deformation is expected.

The polymer material which satisfies the above conditions is exemplified by cyanoethylated polyvinyl alcohol (hereinafter referred to as "cyanoethylated PVA").

In the present invention, the viscoelastic matrix 24 is not limited to a matrix formed of a single viscoelastic material such as cyanoethylated PVA.

That is, for the purpose of adjusting dielectric characteristics, mechanical characteristics, and the like, other dielectric polymer materials may be optionally added to the viscoelastic matrix 24 in addition to the viscoelastic material such as cyanoethylated PVA.

Examples of the addible dielectric polymer material include fluorine-based polymers such as polyvinylidene fluoride, vinylidene fluoride-tetrafluoroethylene copolymers, vinylidene fluoride-trifluoroethylene copolymers, polyvinylidene fluoride-trifluoroethylene copolymers, and polyvinylidene fluoride-tetrafluoroethylene copolymers; cyano group- or cyanoethyl group-containing polymers such as vinylidene cyanide-vinyl acetate copolymers, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; and synthetic rubbers such as nitrile rubber and chloroprene rubber.

Among these, the cyanoethyl group-containing polymer materials are preferably used.

In addition, the dielectric polymer that can be added to the viscoelastic matrix 24 of the piezoelectric body layer 12 in addition to cyanoethylated PVA is not limited to one kind, and plural kinds thereof may be added.

The amount of the polymer or polymers to be added to the viscoelastic matrix 24 of the piezoelectric body layer 12 apart from the viscoelastic material such as cyanoethylated PVA is not particularly limited. The polymer or polymers preferably account for not more than 30% by weight of the viscoelastic matrix 24.

The polymer or polymers added in such an amount will exhibit their own characteristics without impairing the viscoelasticity relaxation mechanism in the viscoelastic matrix 24. Consequently, from the viewpoints of increase in dielectric constant, improvement in heat resistance, improvement in adhesion to the piezoelectric particles 26 or the electrode layers, and the like, favorable results are obtained.

The piezoelectric particles 26 are comprised of ceramic particles having a perovskite crystal structure or a wurtzite crystal structure.

Examples of the ceramic particles constituting the piezoelectric particles 26 include lead zirconate titanate (PZT), lead lanthanate zirconate titanate (PLZT), barium titanate ($BaTiO_3$), zinc oxide (ZnO), and a solid solution of barium titanate and bismuth ferrite ($BiFe_3$) (BFBT).

In the present invention, the particle size of the piezoelectric particles 26 is not particularly limited. However, according to the examination conducted by the present inventor, the particle size of the piezoelectric particles 26 is preferably 1 to 10 μm.

If the particle size of the piezoelectric particles 26 is within the above range, it is possible to obtain favorable results from the viewpoint that outstanding piezoelectric characteristics become compatible with high flexibility, and other viewpoints.

In FIG. 1, the piezoelectric particles 26 in the piezoelectric body layer 12 are dispersed with regularity in the viscoelastic matrix 24. However, the present invention is not limited thereto.

That is, the piezoelectric particles 26 in the piezoelectric body layer 12 may be dispersed in the viscoelastic matrix 24 irregularly as long as their dispersion is desirably uniform.

In the converter film 10 of the present invention, the ratio between the amount of the viscoelastic matrix 24 and the amount of the piezoelectric particles 26 in the piezoelectric body layer 12 (polymeric composite piezoelectric body) is not particularly limited. That is, the ratio between the amount of the viscoelastic matrix 24 and the amount of the piezoelectric particles 26 may be appropriately set according to the size (size in the surface direction) or thickness of the converter film 10, the use of the converter film 10, characteristics required of the converter film 10, and the like.

According to the examination conducted by the present inventor, the volume fraction of the piezoelectric particles 26 in the piezoelectric body layer 12 is preferably 30 to 70%, with a volume fraction of 50% or higher being particularly preferred. Therefore, the volume fraction is more preferably 50 to 70%.

If the ratio between the amount of the viscoelastic matrix 24 and the amount of the piezoelectric particles 26 is within the above range, it is possible to obtain favorable results from the viewpoint that outstanding piezoelectric characteristics become compatible with high flexibility, and other viewpoints.

In the converter film 10 of the present invention, the thickness of the piezoelectric body layer 12 is not particularly limited, either. The thickness may be appropriately set according to the size of the converter film 10, the use of the converter film 10, characteristics required of the converter film 10, and the like.

According to the examination conducted by the present inventor, the thickness of the piezoelectric body layer 12 is preferably 20 to 200 μm, especially 30 to 100 μm.

If the thickness of the piezoelectric body layer 12 is within the above range, it is possible to obtain favorable results from the viewpoint of ensuring rigidity and, at the same time, achieving appropriate pliability, and other viewpoints.

It should be noted that as described above, the piezoelectric body layer 12 preferably undergoes polarization processing (poling). Polarization processing will be detailed later.

As shown in FIG. 1, the converter film 10 of the present invention has the configuration in which the piezoelectric body layer 12 is interposed between the thin film electrodes 14 and 16, and the thus obtained laminate is interposed between the protective layers 18 and 20.

In the converter film 10, the protective layers 18 and 20 are adapted to impart appropriate rigidity and mechanical strength to the polymeric composite piezoelectric body. That is, in the converter film 10 of the present invention, the polymeric composite piezoelectric body (piezoelectric body layer 12) consisting of the viscoelastic matrix 24 and the piezoelectric particles 26 exhibits excellent flexibility when suffering from gentle bending deformation, while it may not be adequate in rigidity or mechanical strength depending on the use of the film. The converter film 10 is provided with the protective layers 18 and 20 to correct such a flaw.

The protective layers 18 and 20 are not particularly limited, and various sheet-like substances can be used.

Preferable examples thereof include various resin films (plastic films). Among these, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), and cyclic olefin resins are suitably used because these have excellent mechanical characteristics and heat resistance.

The thickness of the protective layers 18 and 20 is not particularly limited, either. Basically, the protective layers 18 and 20 have the same thickness, but the thickness may be different.

If the rigidity of the protective layers 18 and 20 is too high, the expansion and contraction of the piezoelectric body layer 12 is restricted, and the flexibility is also impaired. Accordingly, except for the case that requires mechanical strength or excellent handleability as a sheet-like substance, the thinner the protective layers 18 and 20 are, the more advantageous they are.

According to the examination conducted by the present inventor, if the thickness of the protective layers 18 and 20 is at most two times as large as the thickness of the piezoelectric body layer 12, it is possible to obtain favorable results from the viewpoint of ensuring rigidity and, at the same time, achieving appropriate pliability, and other viewpoints.

For example, when the thickness of the piezoelectric body layer 12 is 50 µm, and the protective layers 18 and 20 are formed of PET, the thickness of the protective layers 18 and 20 is preferably 100 µm or less, more preferably 50 µm or less, and particularly preferably 25 µm or less.

In the converter film 10 of the present invention, the thin film electrode 14 is formed between the piezoelectric body layer 12 and the protective layer 18, and the thin film electrode 16 is formed between the piezoelectric body layer 12 and the protective layer 20.

The thin film electrodes 14 and 16 are provided to apply an electric filed to the converter film 10.

In the present invention, the material forming the thin film electrodes 14 and 16 is not particularly limited, and various conductive materials can be used. Specific examples thereof include carbon, palladium, iron, tin, aluminum, nickel, platinum, gold, silver, copper, chromium, molybdenum, alloys of these, and indium tin oxide. Among these, any one of copper, aluminum, gold, silver, platinum, and indium tin oxide is preferable.

Moreover, the formation method of the thin film electrodes 14 and 16 is not particularly limited, and it is possible to use various known methods including a film formation method implemented by a vapor-phase deposition method (vacuum film formation method) such as vacuum deposition or sputtering, or plating, and the method in which foil formed of the above material is adhered to the piezoelectric body layer.

Particularly, a thin film of copper or aluminum that is formed into a film by vacuum deposition is suitably used as the thin film electrodes 14 and 16, since this film can ensure flexibility of the converter film 10. Especially, a thin copper film formed by vacuum deposition is suitable for use.

The thickness of the thin film electrodes 14 and 16 is not particularly limited. Basically, the thin film electrodes 14 and 16 have the same thickness, but the thickness may be different.

Similarly to the protective layers 18 and 20 described above, if the rigidity of the thin film electrodes 14 and 16 is too high, the expansion and contraction of the piezoelectric body layer 12 is restricted, and the flexibility is impaired.

Accordingly, the thinner the thin film electrodes 14 and 16 are, the more advantageous they are, as long as the electric resistance does not become too high.

According to the examination conducted by the present inventor, it is preferable that a product of the thickness of the thin film electrodes 14 and 16 and the Young's modulus thereof be smaller than a product of the thickness of the protective layers 18 and 20 and the Young's modulus thereof, since the flexibility is not significantly impaired.

For example, when a combination of the protective layers 18 and 20 formed of PET (Young's modulus: about 6.2 GPa) and the thin film electrodes 14 and 16 formed of copper (Young's modulus: about 130 GPa) is used, provided that the thickness of the protective layers 18 and 20 is 25 µm, the thickness of the thin film electrodes 14 and 16 is preferably 1.2 µm or less, more preferably 0.3 µm or less, and particularly preferably 0.1 µm or less.

The thin film electrode 14 and/or the thin film electrode 16 may not necessarily be formed on the entire surface of the piezoelectric body layer 12 (the protective layer 18 and/or the protective layer 20).

That is, in a possible configuration, for instance, at least one of the thin film electrodes 14 and 16 is smaller than the piezoelectric body layer 12, and the piezoelectric body layer 12 comes into direct contact with the protective layer in the margin of the converter film 10.

In addition, the protective layer 18 and/or the protective layer 20 having the thin film electrode 14 and/or the tin film electrode 16 formed on the entire surface thereof may not necessarily be formed on the entire surface of the piezoelectric body layer 12. In that case, the protective layer 18 and/or the protective layer 20 may have another (second) protective layer additionally provided on the front side thereof that comes into direct contact with the piezoelectric body layer 12.

As described above, the converter film 10 of the present invention has the configuration in which the piezoelectric body layer 12 (polymeric composite piezoelectric body), which is obtained by dispersing the piezoelectric particles 26 in the viscoelastic matrix 24 exhibiting viscoelasticity at ordinary temperatures, is interposed between the thin film electrodes 14 and 16, and the laminate obtained as above is interposed between the protective layers 18 and 20.

In the converter film 10 of the present invention, it is preferable that the loss tangent (tan δ) at a frequency of 1 Hz obtained by dynamic viscoelasticity measurement has a local maximum of 0.1 or more at an ordinary temperature.

If such a local maximum is present at an ordinary temperature, even if the converter film 10 externally experiences severe bending deformation which is caused relatively slow at a frequency of several Hz or lower, the stain energy can be caused to diffuse outside in the form of heat. Accordingly, it is possible to prevent cracks from occurring at the interface between the polymer matrix and the piezoelectric particles.

Furthermore, in the converter film 10 of the present invention, the storage modulus (E') at a frequency of 1 Hz obtained by dynamic viscoelasticity measurement is preferably 10 to 30 GPa at 0° C. and 1 to 10 GPa at 50° C.

If the storage modulus is as above, the converter film 10 can have considerable frequency dispersion in the storage modulus (E') at ordinary temperatures. That is, the converter film 10 can exhibit hardness with respect to vibration at 20 Hz to 20 kHz while exhibiting softness with respect to vibration at a frequency of several Hz or lower.

In addition, in the converter film 10 of the present invention, a product of the thickness of the film and the storage modulus (E') at a frequency of 1 Hz obtained by dynamic viscoelasticity measurement is preferably $1.0\times10^6$ N/m to $2.0\times10^6$ N/m (1.0 E+06 N/m to 2.0 E+06 N/m) at 0° C. and $1.0\times10^5$ N/m to $1.0\times10^6$ N/m (1.0 E+05 N/m to 1.0 E+06 N/m) at 50° C.

If the product is within the above range, the converter film 10 can have appropriate rigidity and mechanical strength within a range that does not impair flexibility and acoustic characteristics.

Moreover, in the converter film 10 of the present invention, it is preferable that, on a master curve obtained from dynamic viscoelasticity measurement, the loss tangent (tan δ) at 25° C. and at a frequency of 1 kHz is 0.05 or more.

If the loss tangent is as above, the speaker using the converter film 10 has smooth frequency characteristics, and thus, when the lowest resonance frequency $f_0$ varies with the change in the curvature of the speaker, the degree of change in the sound quality can be reduced.

Figure 2A:
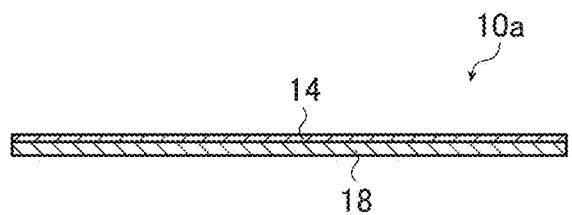
FIGS. 2A to 2E are schematic views illustrating an example of a manufacturing method of the electroacoustic converter film shown in FIG. 1.

Next an example of manufacturing method of the electroacoustic converter film of the present invention will be described with reference to FIG. 2. First, as shown in FIG. 2A, a sheet-like substance 10a in which the thin film electrode 14 is formed on the protective layer 18 is prepared.

The sheet-like substance 10a may be prepared by forming a thin copper film as the thin film electrode 14 on the surface of the protective layer 18 by means of vacuum deposition, sputtering, plating, or the like. Alternatively, a commercially available product in which a thin copper film or the like is formed on the protective layer 18 may be used as the sheet-like substance 10a.

Meanwhile, a polymer material (hereinafter also referred to as "viscoelastic material") such as cyanoethylated PVA that exhibits viscoelasticity at ordinary temperatures is dissolved in an organic solvent, the piezoelectric particles 26 such as PZT particles are added thereto and dispersed by stirring, whereby a coating material is prepared. The organic solvent is not particularly limited, and various organic solvents such as dimethylformamide (DMF), methyl ethyl ketone, and cyclohexanone can be used.

Figure 2B:
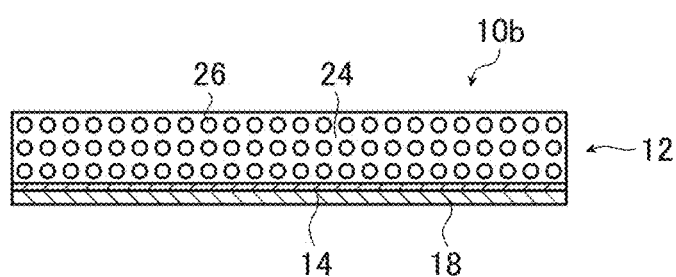

After the sheet-like substance 10a and the above coating material are prepared, the coating material is casted (applied) to the sheet-like substance 10a, and dried by evaporating the organic solvent. In this manner, as shown in FIG. 2B, a laminate 10b in which the thin film electrode 14 is on the protective layer 18 and the piezoelectric body layer 12 is on the thin film electrode 14 is prepared.

The casting method of the coating material is not particularly limited, and any known method (coating apparatus) such as a slide coater or a doctor knife can be used.

Alternatively, if the viscoelastic material is a material that can be melted by heating just like cyanoethylated PVA, the viscoelastic material may be melted by heating, and the piezoelectric particles 26 may be added to the melted material and dispersed therein to prepare a melt. By extrusion or the like, the melt may be extruded in the form of sheet onto the sheet-like substance shown in FIG. 2A and then cooled, whereby the laminate 10b in which the thin film electrode 14 is on the protective layer 18 and the piezoelectric body layer 12 is on the thin film electrode 14 as shown in FIG. 2B may be prepared.

As described above, in the converter film 10 of the present invention, piezoelectric polymer materials such as PVDF may be added to the viscoelastic matrix 24 in addition to the viscoelastic material such as cyanoethylated PVA.

The piezoelectric polymer material to be added to the viscoelastic matrix 24 may be dissolved in the aforementioned coating material. Alternatively, the piezoelectric polymer material to be added may be added to the viscoelastic material melted by heating, and the resultant mixture may be melted by heating.

After the laminate 10b in which the thin film electrode 14 is on the protective layer 18 and the piezoelectric body layer 12 is on the thin film electrode 14 is prepared, it is preferable to perform polarization processing (poling) on the piezoelectric body layer 12.

The method of performing polarization processing on the piezoelectric body layer 12 is not particularly limited, and the known methods can be used. Examples of preferable polarization methods include the method as illustrated in FIGS. 2C and 2D.

Figure 2C:
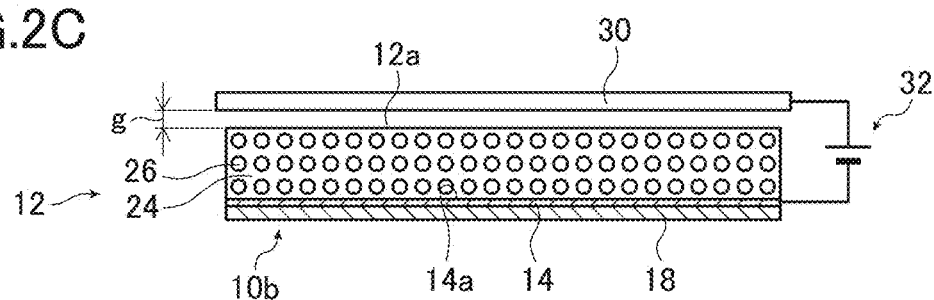
Figure 2D:
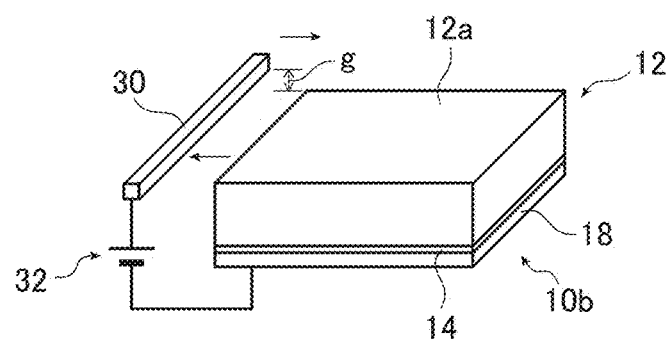

In this method, as shown in FIGS. 2C and 2D, a rod-like or wire-like movable corona electrode 30 is placed above an upper surface 12a of the piezoelectric body layer 12 of the laminate 10b along the upper surface 12a, in a state where there is a space g of, for example, 1 mm between the electrode and the upper surface. Then the corona electrode 30 and the thin film electrode 14 are connected to a DC power supply 32.

Moreover, heating means for keeping the laminate 10b heated, a hot plate for instance, is prepared.

Thereafter, in a state where the piezoelectric body layer 12 is kept heated by the heating means at a temperature of, for example, 100° C., DC voltage of several kV, for example, 6 kV, is applied between the thin film electrode 14 and the corona electrode 30 from the DC power supply 32, whereby corona discharge is caused to occur. Moreover, in a state where the space g is maintained as is, the corona electrode 30 is moved (caused to scan) along the upper surface 12a of the piezoelectric body layer 12 to perform polarization processing on the piezoelectric body layer 12.

In the polarization processing using corona discharge as above (hereinafter also referred to as "corona poling processing" for convenience' sake), the corona electrode 30 may be moved by using a known means for moving a rod-like object.

In addition, the method for the corona poling processing is not limited to the method in which the corona electrode 30 is moved. That is, the corona electrode 30 may be fixed, and a moving mechanism for moving the laminate 10b may be provided to move the laminate 10b for performing the polarization processing. For moving the laminate 10b, a known means for moving a sheet-like object may be used.

Moreover, the corona electrode 30 is not limited to one in number, and plural corona electrodes 30 may be used for performing corona poling processing.

Furthermore, the polarization processing is not limited to the corona poling processing, and it is possible to use normal electric field poling that directly applies direct electric field to a target for polarization processing. In the case of normal electric field poling, however, the thin film electrode 16 needs to be formed before the polarization processing.

Before the polarization processing, calendar processing for smoothening the surface of the piezoelectric body layer 12 by using a heating roller or the like may be performed. If the calendar processing is performed, a thermocompression bonding step, which will be described later, can be smoothly conducted.

Meanwhile, a sheet-like substance 10c in which the thin film electrode 16 is formed on the protective layer 20 is prepared. The sheet-like substance 10c is similar to the aforementioned sheet-like substance 10a.

Figure 2E:
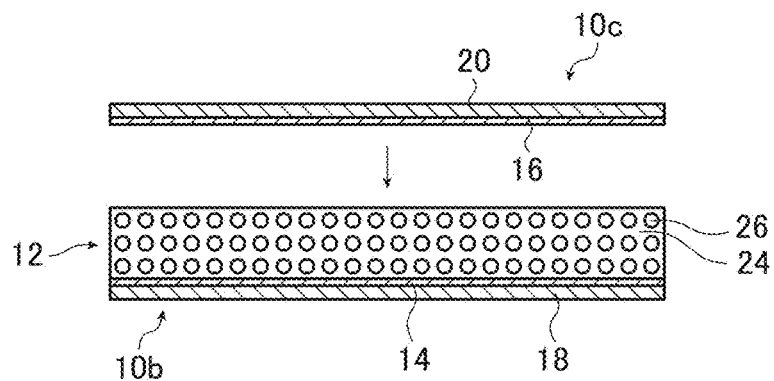

As shown in FIG. 2E, in a state where the thin film electrode 16 faces the piezoelectric body layer 12, the sheet-like substance 10c is laminated on the laminate 10b having undergone the polarization processing of the piezoelectric body layer 12.

Subsequently, the laminate of the laminate 10b and the sheet-like substance 10c is subjected to thermocompression bonding by using a heating press apparatus or a pair of heating rollers in such a manner that the laminate is pinched at the protective layers 18 and 20. In this way, the converter film 10 of the present invention as shown in FIG. 1 is completed.

While the converter film 10 of the present invention may be manufactured by using the above sheet-like substance in the form of a cut sheet, it is preferable to use a roll-to-roll (hereinafter also referred to as "R-to-R") mode for the manufacture.

As is well known, in an R-to-R mode, an elongated raw material as wound into a roll is pulled out of the roll and transported in its longitudinal direction, and various treatments such as film forming treatment and surface treatment are conducted on the raw material under transport. The treated raw material is wound again into a roll.

When the converter film 10 is manufactured by the above manufacturing method in an R-to-R mode, a first roll obtained by winding up the sheet-like substance 10a in which the thin film electrode 14 is formed on the long protective layer 18, and a second roll obtained by winding up the sheet-like substance 10c in which the thin film electrode 16 is formed on the long protective layer 20 are used.

The first roll may be exactly the same as the second roll.

While pulled out of the roll and transported in its longitudinal direction, the sheet-like substance 10a is coated with the coating material containing cyanoethylated PVA and the piezoelectric particles 26, and dried by heating or the like to form the piezoelectric body layer 12 on the thin film electrode 14, whereby the aforementioned laminate 10b is obtained.

Thereafter, the aforementioned corona poling is conducted to perform polarization processing on the piezoelectric body layer 12. When the converter film 10 is manufactured in an R-to-R mode, while the laminate 10b is being transported, the corona electrode 30, which is so fixed as to extend in a direction orthogonal to the transport direction of the laminate 10b, is used to perform polarization processing on the piezoelectric body layer 12 by means of corona poling. It should be noted that as described above, calendar processing may be performed before the polarization treatment.

Subsequently, while the sheet-like substance 10c is being pulled out of the second roll, and the sheet-like substance 10c and the laminate are being transported, the sheet-like substance 10c is laminated on the laminate 10b by a known method using a laminating roller or the like, in a state where the thin film electrode 16 faces the piezoelectric body layer 12 as described above.

The resultant laminate is subjected to thermocompression bonding by transporting it between a pair of heating rollers in such a manner that the laminate is pinched at the protective layers 18 and 20. In this way, the converter film 10 of the present invention is completed and then wound into a roll.

In the example described above, the sheet-like substance (laminate) is transported only once in its longitudinal direction to manufacture the converter film 10 of the present invention in an R-to-R mode, to which the present invention is not limited.

For example, after the laminate is formed and the corona poling is performed, the laminate may temporarily be wound into a roll so as to form a laminate roll. Thereafter, while the laminate is being pulled out of the laminate roll and being transported in its longitudinal direction, the sheet-like substance in which the thin film electrode 16 is formed on the protective layer 20 may be laminated as described above, whereby the converter film 10 may be completed and wound into a roll.

Figure 3A:
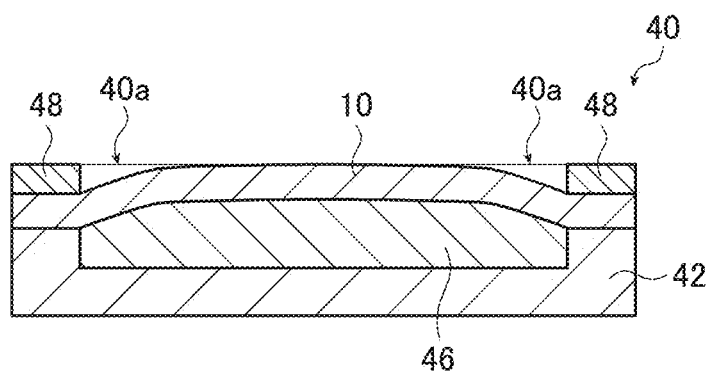
FIGS. 3A to 3C are schematic views for illustrating an example of a piezoelectric speaker using the electroacoustic converter film of the present invention.
Figure 3B:
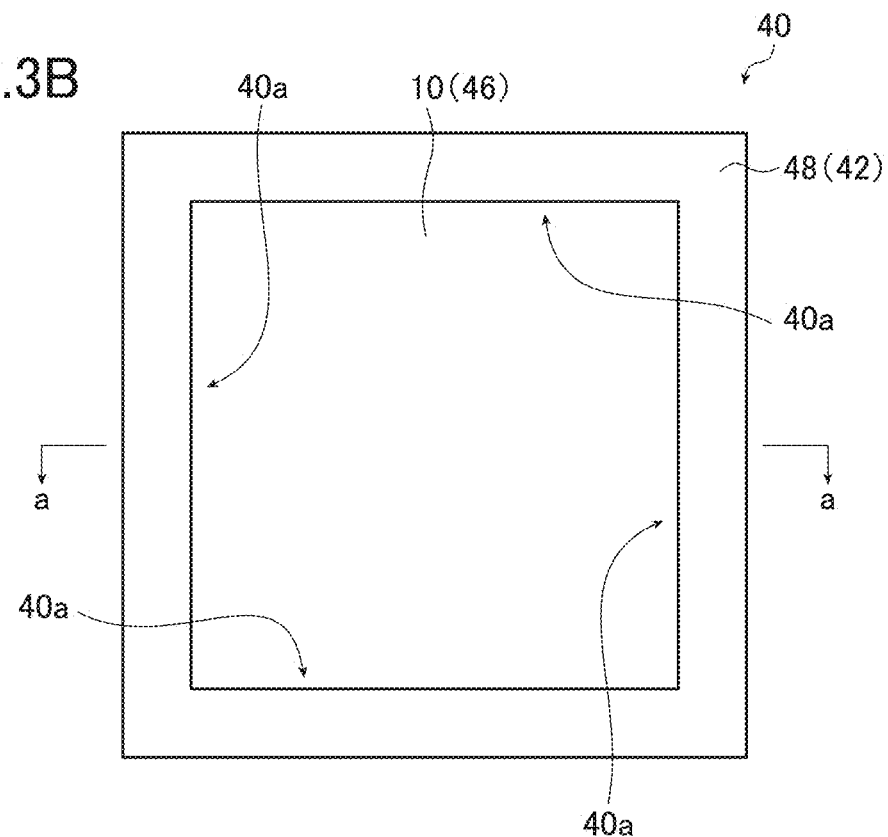

FIGS. 3A and 3B are schematic views illustrating an example of a flat plate-type piezoelectric speaker using the converter film 10 of the present invention. FIG. 3B shows the speaker as viewed in the vibration direction (sound radiation direction) of the converter film 10, while FIG. 3A is a cross-sectional view of the speaker as viewed in a direction orthogonal to the viewing direction of FIG. 3B, that is to say, a cross-sectional view along line a-a in FIG. 3B.

A piezoelectric speaker 40 is a flat plate-type piezoelectric speaker using the aforementioned converter film 10 of the present invention, which consists of the piezoelectric body layer 12, the thin film electrodes 14 and 16 disposed on both sides of the piezoelectric body layer 12, and the protective layers 18 and 20 disposed on the surfaces of the two thin film electrodes, respectively, as a speaker diaphragm converting electric signals into vibration energy.

The piezoelectric speaker 40 (and a piezoelectric speaker 50 which will be described later) can also be used as a microphone or a sensor.

The piezoelectric speaker 40 as shown is basically configured with the converter film 10 (piezoelectric film), a case 42, a viscoelastic support 46, and a frame 48.

The case 42 is a chassis that is formed of plastic or the like and has the shape of a regular quadrangular prism which is small in height, hollow, and open at one face. In the piezoelectric speaker using the vibrating body of the present invention, the case 42 (namely, the piezoelectric speaker) is not limited in shape to a regular quadrangular prism, so that chassis in various shapes including a cylindrical chassis and a quadrangular-prismatic chassis with a rectangular bottom face are available.

The frame 48 is a plate material that has a through hole in the center thereof and has the shape similar to that of the upper end face (the open side) of the case 42.

The viscoelastic support 46 has an appropriate degree of viscosity and elasticity and supports the converter film 10. Moreover, the viscoelastic support 46 applies a constant mechanical bias to the piezoelectric film at any location of the film, such that the expansion and contraction movement of the converter film is completely converted into back and forth movement (movement in the direction perpendicular to the film surface). Examples of the viscoelastic support 46 include non-woven fabrics such as wool felt and rayon- or PET-containing wool felt, as well as glass wool. In the example as illustrated, the viscoelastic support 46 has the shape of a quadrangular prism whose bottom face is slightly larger than the bottom face of the case 42. The specific gravity of the viscoelastic support 46 is not particularly limited and may be appropriately selected according to the type of the viscoelastic support. For example, when felt is used as the viscoelastic support, the specific gravity thereof is preferably 100 to 500 kg/cm$^3$ and more preferably 200 to 300 kg/cm$^3$. If glass wool is used as the viscoelastic support, the specific gravity thereof is preferably 20 to 100 kg/cm$^3$.

The piezoelectric speaker 40 is configured such that the viscoelastic support 46 is accommodated in the case 42, the case 42 and the viscoelastic support 46 are covered with the converter film 10, and the frame 48 is fixed to the case 42 in a state where the margin of the converter film 10 is pressed against the upper end face of the case 42 by the frame 48.

The method for fixing the frame to the case 42 is not particularly limited, and it is possible to use various known methods such as a method using screws or bolts and nuts and a method using a fixing jig.

Figure 3C:
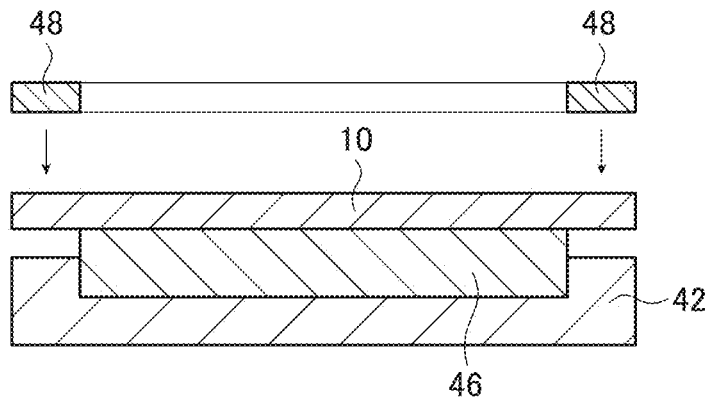

In the piezoelectric speaker 40, the viscoelastic support 46 has the shape of a quadrangular prism whose height (thickness) is greater than the height of the inner surface of the case 42. That is, as schematically illustrated in FIG. 3C, in a state where the converter film 10 and the frame 48 are not fixed yet, the viscoelastic support 46 protrudes from the top surface of the case 42.

Consequently, in the piezoelectric speaker 40, the viscoelastic support 46 is held in a state where the thickness of the peripheral portion of the viscoelastic support 46 has been reduced since the peripheral portion is pressed downward by the converter film 10. Likewise, in the peripheral portion of the viscoelastic support 46, the radius of curvature of the converter film 10 sharply changes. Therefore, in the converter film 10, a rising portion 40a where the converter film 10 goes down toward the periphery of the viscoelastic support 46 is formed. In addition, the central region of the converter film 10 is pressed against the viscoelastic support 46 having the shape of a quadrangular prism and is thus made (almost) planar.

At this time, it is preferable that the viscoelastic support 46 is pressed over its entire surface in the surface direction of the converter film 10 so that the support may be reduced in thickness as a whole.

In the piezoelectric speaker using the converter film 10 of the present invention, the pressure applied to the viscoelastic support 46 by the converter film 10 is not particularly limited. However, it is preferable to control the pressure to be about 0.02 to 0.2 MPa in terms of the unit pressure in a planar portion (flat portion).

The angle (tilt angle (average tilt angle) with respect to a central planar portion) of the rising portion 40a is not particularly limited. However, in view of making it possible for the converter film 10 to sufficiently perform up and down movement, it is preferable to set the angle at about 10 to 90°.

The difference in height (in the example illustrated, the distance between a location closest to the bottom face of the frame 48 and a location farthest from the bottom face of the frame 48) of the converter film 10 is not particularly limited. However, in view of making it possible for the converter film 10 to constitute a thin planar speaker and to sufficiently perform up and down movement, it is preferable to set the difference in height at about 1 to 10 mm.

In addition, the thickness of the viscoelastic support 46 is not particularly limited. However, the thickness of the viscoelastic support 46 not yet being pressed is preferably 1 to 50 mm.

In the piezoelectric speaker 40, when the converter film 10 expands in the in-plane direction by the application of voltage to the piezoelectric body layer 12, the rising portion 40a of the converter film 10 slightly changes its angle in a direction of rising (direction in which the angle with respect to the surface direction of the converter film 10 becomes closer to 90°) in order to absorb the expansion. As a result, the converter film 10 having a planar portion moves upward (in a sound radiation direction).

Inversely, when the converter film 10 contracts in the in-plane direction by the application of voltage to the piezoelectric body layer 12, the rising portion 40a of the converter film 10 slightly changes its angle in a direction of falling down (direction of approaching a planar state) in order to absorb the contraction. As a result, the converter film 10 having a planar portion moves downward.

The piezoelectric speaker 40 generates sound by such vibration of the converter film 10.

In the rising portion 40a of the converter film 10, the viscoelastic support 46 is more compressed in the thickness direction thereof at locations closer to the frame 48. However, due to an effect of static viscoelasticity (stress relaxation), the mechanical bias can be kept constant at any location of the piezoelectric film. For this reason, the expansion and contraction movement of the piezoelectric film is completely converted into the back and forth movement and accordingly, it is possible to obtain a planar piezoelectric speaker which is thin, can produce sufficient volume, and has excellent acoustic characteristics.

In the piezoelectric speaker 40 as illustrated, the entire margin of the converter film 10 is pressed against the case 42 (that is, the viscoelastic support 46) by the frame 48. However, the present invention is not limited thereto.

That is, the piezoelectric speaker using the converter film 10 of the present invention may not have the frame 48. For example, the piezoelectric speaker can be configured such that, at four corners of the case 42, the converter film 10 is pressed against/fixed to the top face of the case 42 by screws, bolts and nuts, jigs or the like.

Moreover, an O-ring or the like may be disposed between the case 42 and the converter film 10. If the speaker has such configuration, it is possible to obtain a damper effect and to obtain better acoustic characteristics by preventing the vibration of the converter film 10 from being transferred to the case 42.

Further, the piezoelectric speaker using the converter film 10 of the present invention may not have the case 42 accommodating the viscoelastic support 46.

That is, as schematically illustrating in FIG. 4, which is a cross-sectional view of the piezoelectric speaker 50 as an example, the piezoelectric speaker can also be configured as follows. In the configuration, the viscoelastic support 46 is placed on a rigid support plate 52, the converter film 10 covering the viscoelastic support 46 is provided, and the aforementioned frame 48 is placed in the peripheral portion. Then the frame 48 is fixed to the support plate 52 by screws 54 such that the frame 48 is pressed together with the viscoelastic support 46. In this manner, the peripheral portion of the viscoelastic support 46 becomes thin, and a tilt portion of the converter film 10 is formed.

Also in this configuration not having the case 42, the viscoelastic support 46 may be held in a pressed state to become thin by using screws or the like, without using the frame 48.

Moreover, the piezoelectric speaker using the converter film 10 of the present invention is not limited to the configuration in which the periphery thereof is pressed. For example, the piezoelectric speaker can be configured such that the center of the laminate of the viscoelastic support 46 and the converter film 10 is pressed by certain means, and the viscoelastic support 46 is held in a thinned state.

That is, the piezoelectric speaker using the converter film 10 of the present invention can be configured in various ways, as long as the viscoelastic support 46 is pressed by the converter film 10 and is held in a state where the thickness thereof has been reduced, a radius of curvature of the converter film 10 sharply changes due to the state of pressing/holding described above, and the rising portion 40a is formed in the converter film 10.

Figure 4:
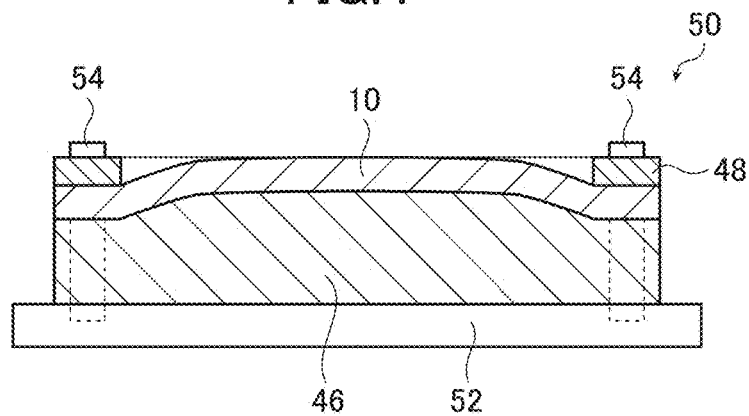
FIG. 4 is a view schematically illustrating another example of the piezoelectric speaker using the electroacoustic converter film of the present invention.

The piezoelectric speakers illustrated in FIGS. 3 and 4 each use the viscoelastic support 46. However, the piezoelectric speaker using the converter film 10 of the present invention is not limited to this configuration.

As an example, a piezoelectric speaker 56 illustrated in FIG. 5C will be described.

Figure 5A:
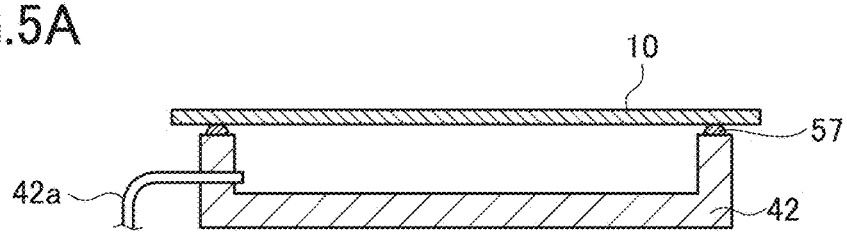
FIGS. 5A to 5C are schematic views for illustrating yet another example of the piezoelectric speaker using the electroacoustic converter film of the present invention.

First, as shown in FIG. 5A, the piezoelectric speaker 56 uses a case having airtightness as the case 42 and is provided with a pipe 42a for injecting air into the case 42.

An O-ring 57 is disposed on the top face of the edge on the opened side of the case 42, and is covered with the converter film 10 so as to close the open face of the case 42.

Figure 5B:
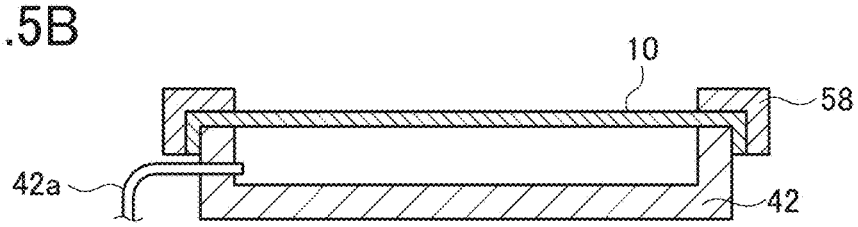
Figure 5C:
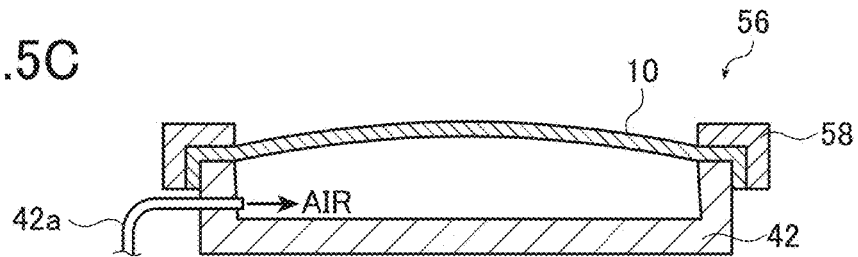

Thereafter, as shown in FIG. 5B, a frame-like press lid 58, which has an inner circumference approximately the same as the outer circumference of the case 42 and has an approximately L-shaped cross-section, is caused to fit onto the outer edge of the case 42 (in FIGS. 5B and 5C, the O-ring 57 is not illustrated).

As a result, the converter film 10 is pressed against and fixed to the case 42, and the inside of the case 42 is closed in an airtight state by the converter film 10.

Subsequently, as shown in FIG. 5C, air is injected into the case 42 (closed space formed by the case 42 and the converter film 10) through the pipe 42a so as to apply pressure to the converter film 10 to inflate it convexly. This state is maintained to obtain the piezoelectric speaker 56.

The pressure in the case 42 is not limited but may be any pressure higher than atmospheric pressure at which the converter film 10 can be inflated outwardly in a convex manner.

The pipe 42a may be fixed or may be detachable. Needless to say, when the pipe 42a is detached, the portion from which the pipe is detached needs to be closed in an airtight state.

The flexible display of the present invention is a flexible sheet-like image display apparatus which uses the aforementioned converter film 10 (electroacoustic converter film) of the present invention as a speaker.

Specifically, the flexible display of the invention is a speaker mounting type flexible display in which the converter film 10 of the present invention is attached as a speaker to the back face (opposite with the image display surface) of a flexible sheet-like display device such as a flexible organic EL display device, a flexible liquid crystal display device, or flexible electronic paper.

The flexible display of the present invention may be either a color display or a monochromatic display.

As described above, the converter film 10 of the present invention has excellent pliability and flexibility and does not exhibit in-plane anisotropy. Accordingly, when the converter film 10 of the present invention is bent, the sound quality only changes to a small extent and the degree of change in sound quality according to the change in the curvature is also only small irrespective of the bending direction.

Therefore, the speaker mounting type flexible display of the present invention in which the vibrating film 10 of the present invention is attached to a flexible image display device has excellent flexibility and, moreover, can output sound with stable sound quality regardless of the bending direction or the degree of bending at the time, for example, when the display is gripped by hand (that is to say, suitably responding to any deformation).

FIG. 6A schematically illustrates an example in which the flexible display of the present invention is used in an organic EL (electroluminescence) display.

An organic EL display 60 shown in FIG. 6A is a speaker mounting type organic EL flexible display in which the converter film 10 of the present invention is attached to the back face of a flexible sheet-like organic EL display device 62.

Regarding the flexible display of the present invention, there is no limitation on the method of attaching the converter film 10 of the present invention to the back face of a flexible sheet-like image display device such as the organic EL display device 62. That is, it is possible to use any known method of attaching (laminating) two sheet-like substances together in a state where they are facing each other.

Exemplary methods include a bonding method using an adhesive, a bonding method implemented by thermal fusion, a method using a double-sided tape, a method using an adhesive tape, a method using a jig such as an approximately C-shaped clamp that clamps a laminate of plural sheet-like substances at an end or an edge side of the laminate, a method using a jig such as a rivet that clamps a laminate of plural sheet-like substances in a surface (other than the image display surface), a method of clamping a laminate of plural sheet-like substances from both sides of the laminate by using protective films (transparent one at least on the image displaying side), and a combination thereof.

When the display device and the converter film 10 are bonded together with an adhesive or the like, they may be bonded together wholly, or partly in their entire margins or at appropriately selected spots, such as four corners and the center, with any combination of such bonding techniques being also available.

In the organic EL display 60, the converter film 10 is the aforementioned (electroacoustic) converter film 10 of the present invention which is configured with the piezoelectric body layer 12 comprising a polymeric composite piezoelectric body, the thin film electrode 14 that is disposed on one side of the piezoelectric body layer 12, the thin film electrode 16 that is disposed on the other side of the piezoelectric body layer 12, the protective layer 18 that is disposed on the surface of the thin film electrode 14, and the protective layer 20 that is disposed on the surface of the thin film electrode 16.

The organic EL display device 62 is a known flexible sheet-like organic EL display device (organic EL display panel).

That is, for example, the organic EL display device 62 is configured with a substrate 64 that is formed of a plastic film or the like, an anode 68 that is disposed on the substrate 64 and consists essentially of pixel electrodes having a switching circuit such as TFT, a light emitting layer 70 that is disposed on the anode 68 and uses an organic EL material, a transparent cathode 72 that is disposed on the light emitting layer 70 and is formed of indium tin oxide (ITO) or the like, and a transparent substrate 74 that is disposed on the cathode 72 and is formed of transparent plastic or the like.

Moreover, a hole injection layer or a hole transport layer may be disposed between the anode 68 and the light emitting layer 70, and an electron transport layer or an electron injection layer may be disposed between the light emitting layer 70 and the cathode 72. Furthermore, a protective film such as a gas barrier film may be disposed on the transparent substrate 74.

It should be noted that wiring for driving the converter film 10, namely the speaker, is connected to the thin film electrodes 14 and 16 of the converter film 10, although the wiring is not illustrated. In addition, wiring for driving the organic EL display device 62 is connected to the anode 68 and the cathode 72.

This configuration also applies to electronic paper 78 and a liquid crystal display 94 which will be described later, and the like.

FIG. 6B schematically illustrates an example in which the flexible display of the present invention is used in electronic paper.

The electronic paper 78 shown in FIG. 6B is a speaker mounting type electronic paper in which the converter film 10 of the present invention is attached to the back face of a flexible sheet-like electronic paper device 80.

For the electronic paper 78, the same converter film 10 as described above is used.

The electronic paper device 80 is known flexible electronic paper. That is, for example, the electronic paper device 80 is configured with a substrate 82 that is formed of a plastic film or the like, a lower electrode 84 that is disposed on the substrate 82 and consists essentially of pixel electrodes having a switching circuit such as TFT, a display layer 86 that is disposed on the lower electrode 84 and consists essentially of arrays of microcapsules 86a containing white and black pigments charged positively or negatively, a transparent upper electrode 90 that is disposed on the display layer 86 and is formed of ITO or the like, and a transparent substrate 92 that is disposed on the upper electrode 90 and is formed of transparent plastic or the like.

The example shown in FIG. 6B is an example in which the flexible display of the present invention is used for electrophoretic electronic paper using microcapsules. However, the present invention is not limited thereto.

That is, the flexible display of the present invention can be used for any known electronic paper as long as it is a flexible sheet-like electronic paper, with examples including electronic papers adopting an electrophoretic mode not using microcapsules, an electrophoretic mode, a chemical change mode using an oxidation-reduction reaction, a mode using an electronic particulate material, an electrowetting mode, a liquid crystal mode, and the like.

FIG. 6C schematically illustrates an example in which the flexible display of the present invention is used for a liquid crystal display.

The liquid crystal display 94 illustrated in FIG. 6C is a speaker mounting type liquid crystal flexible display in which the converter film 10 of the present invention is attached to the back face of a flexible sheet-like liquid crystal display device 96.

For the liquid crystal display 94, the same converter film 10 as described above is used.

The liquid crystal display device 96 is a known flexible sheet-like liquid crystal display device (liquid crystal display panel). That is, for example, the liquid crystal display device 96 has a flexible edge-light type light guide plate 98 and a light source 100 for causing back light to enter from the edge of the light guide plate 98. The liquid crystal display device 96 is configured with, for example, a polarizer 102 that is disposed on the light guide plate 98, a transparent lower substrate 104 that is disposed on the polarizer 102, a transparent lower electrode 106 that is disposed on the lower substrate 104 and consists essentially of pixel electrodes having a switching circuit such as TFT, a liquid crystal layer 108 that is disposed on the lower electrode 106, a transparent upper electrode 110 that is disposed on the liquid crystal layer 108 and is formed of ITO or the like, a transparent upper substrate 112 that is disposed on the upper electrode 110, a polarizer 114 that is disposed on the upper substrate 112, and a protective film 116 that is disposed on the polarizer 114.

It should be noted that the flexible display of the present invention is not limited to organic EL displays, electronic paper or liquid crystal displays. The flexible display of the present invention can be used for image display apparatuses using various display devices as long as the display devices are flexible sheet-like display devices (display panels).

In the converter film 10 of the present invention, which comprises the piezoelectric body layer 12 in which piezoelectric particles are dispersed in a polymer matrix exhibiting viscoelasticity at ordinary temperatures, such as cyanoethylated PVA, the thin film electrodes 14 and 16 that are disposed on the surfaces of the piezoelectric body layer 12, and the protective layers 18 and 20 that are disposed on the surfaces of the thin film electrodes, the piezoelectric body layer 12 also has a function of converting vibration energy into electric signals.

Accordingly, by utilizing such a function, the converter film 10 of the present invention can be suitably used for a microphone or a musical instrument sensor (pickup).

A desirable example is a vocal cord microphone.

Figure 7:
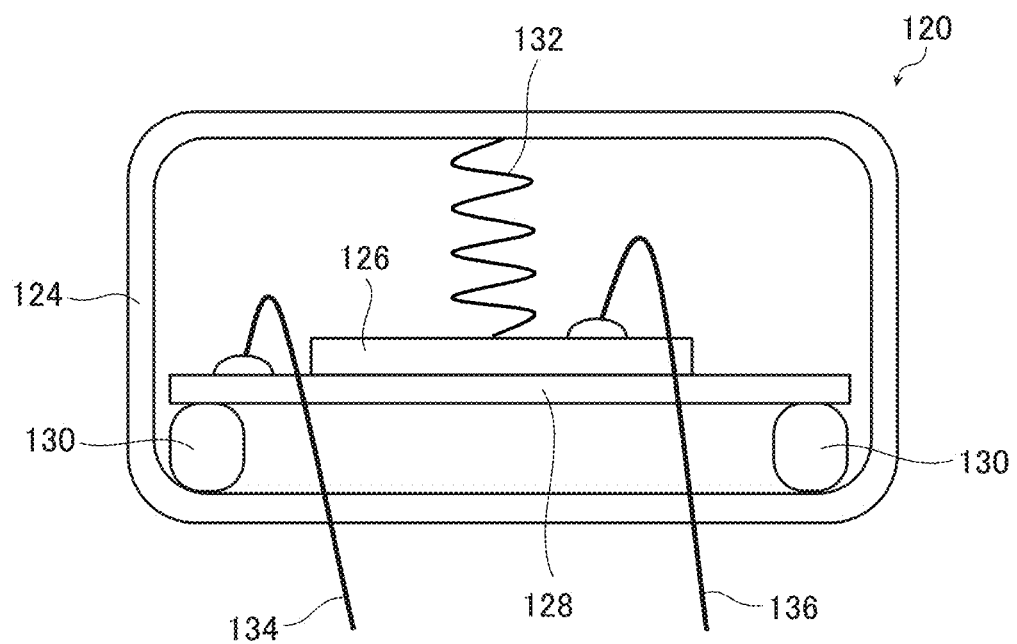
FIG. 7 is a view schematically illustrating the configuration of a general vocal cord microphone.

FIG. 7 schematically illustrates an example of the general vocal cord microphone.

As illustrated in FIG. 7, a general vocal cord microphone 120 that is conventionally used has complicated configuration. In the configuration, a piezoelectric ceramic 126 such as PZT is laminated on a metal plate 128 such as a brass plate, a cushion 130 having elasticity and a spring 132 are attached to the bottom face and the top face of the laminate, respectively, the resultant laminate is supported in a case 124, and signal wires 134 and 136 are drawn out of the case.

In contrast, the vocal cord microphone of the present invention in which the converter film 10 of the present invention is used as a sensor for converting sound signals into electric signals can be simply configured by, for example, providing adhering means on the converter film 10 and providing a signal wire for taking out the electric signals output from the piezoelectric body layer 12 (thin film electrodes 14 and 16).

Moreover, the vocal cord microphone of the present invention configured as above can function as a vocal cord microphone simply by adhering the converter film 10 to the vicinity of the vocal cords.

The conventional vocal cord microphone using the piezoelectric ceramic 126 and the metal plate 128 as shown in FIG. 7 has an extremely small loss tangent. Such a microphone easily causes extremely strong resonance, and has frequency characteristics showing great fluctuation, hence the microphone is prone to have metallic timbre.

In contrast, as described above, the converter film 10 of the present invention has excellent flexibility and acoustic characteristics and only shows a small degree of change in sound quality when deformed. Accordingly, the converter film 10 can be adhered to the faucal region of a human being that has complicated, curved surfaces, and can reproduce sound, from low-pitched sound to high-pitched sound, with high fidelity.

That is, according to the present invention, it is possible to realize an ultra-lightweight and space-saving vocal cord microphone with simple configuration which can output sound signals extremely close to voice and, at the same time, does not make a person who is wearing the microphone conscious of the microphone.

In the vocal cord microphone of the present invention, the method of adhering the converter film 10 to the vicinity of the vocal cords is not particularly limited, and various known methods of adhering a sheet-like substance can be used.

In addition, the converter film 10 may not be directly adhered to the vicinity of the vocal cords. Instead, the converter film 10 may be adhered to the vicinity of the vocal cords by containing it in an extremely thin case or bag.

Furthermore, the musical instrument sensor of the present invention in which the converter film 10 of the present invention is used as a sensor for converting sound signals into electric signals can be simply configured by, for example, providing adhering means to the converter film 10 and providing a signal wire for taking out electric signals output from the piezoelectric body layer 12 (thin film electrodes 14 and 16).

Moreover, the musical instrument sensor of the present invention configured as above can function as a pickup simply by adhering the converter film 10 to the surface of the body of a musical instrument.

Similarly to the case of the aforementioned vocal cord microphone, the converter film 10 of the present invention is thin and has excellent pliability, so that the musical instrument sensor of the present invention has excellent flexibility and acoustic characteristics and only shows a small degree of change in sound quality when deformed. Accordingly, the musical instrument sensor can be adhered to the body of a musical instrument that has complicated, curved surfaces, and can reproduce the sound of the musical instrument, from low-pitched sound to high-pitched sound, with high fidelity.

Moreover, the musical instrument sensor of the present invention hardly imposes mechanical restriction on the vibrating body of a musical instrument. Therefore, it is possible to minimize the influence of the attachment of a pickup on the original sound of a musical instrument.

Similarly to the case of the aforementioned vocal cord microphone, the method of adhering the musical instrument sensor of the present invention to musical instruments is not particularly limited, and various known methods of adhering a sheet-like substance can be used. Moreover, the musical instrument sensor of the present invention may be adhered to musical instruments by containing the converter film 10 in an extremely thin case or bag.

So far, the electroacoustic converter film, the flexible display, the vocal cord microphone, and the musical instrument sensor of the present invention have been described in detail, but the present invention is not limited to the aforementioned examples. Needless to say, the invention can be improved or modified in various ways without departing from the gist of the present invention.

EXAMPLES

Hereinafter, the present invention will be described in more detail based on specific examples of the present invention.

Example 1

By the method as described above and illustrated in FIG. 2, the converter film 10 of the present invention shown in FIG. 1 was prepared.

First, according to the compositional ratio as below, cyanoethylated PVA (CR-V manufactured by Shin-Etsu Chemical Co., Ltd.) was dissolved in dimethylformamide (DMF). To the resultant solution, PZT particles were added at the compositional ratio below, and dispersed by a propeller mixer (rotation frequency of 2,000 rpm), thereby preparing a coating material for forming the piezoelectric body layer 12.

| PZT particles | 300 parts by weight |
|---|---|
| Cyanoethylated PVA | 30 parts by weight |
| DMF | 70 parts by weight |

The PZT particles used were prepared by sintering commercially available PZT raw material powder at 1,000 to 1,200° C. and then performing crushing and classification treatment on the sintered material so as to obtain the particles having an average particle size of 5 μm.

Meanwhile, the sheet-like substances 10a and 10c were prepared by vacuum-depositing a thin copper film having a thickness of 0.1 μm onto a PET film having a thickness of 4 μm. That is, in this example, the thin film electrodes 14 and 16 are each composed of the deposited thin copper film having a thickness of 0.1 μm, and the protective layers 18 and 20 are each composed of the PET film having a thickness of 4 μm.

Onto the thin film electrode 14 (deposited thin copper film) of the sheet-like substance 10a, the coating material for forming the piezoelectric body layer 12, which had been prepared as above, was applied by using a slide coater. Application of the coating material was performed such that the thickness of the dried coating film became 40 μm.

Subsequently, the sheet-like substance 10a of which the top had been coated with the coating material was dried by heating on a hot plate at 120° C. to evaporate DMF. In this manner, the laminate 10b, which had the thin film electrode 14 formed of copper that was disposed on the protective layer 18 made of PET, and the piezoelectric body layer 12 (piezoelectric layer) with a thickness of 40 μm that was disposed on the thin film electrode 14, was prepared.

The piezoelectric body layer 12 of the laminate 10b was subjected to polarization processing by means of the aforementioned corona poling illustrated in FIGS. 2C and 2D. In the polarization processing, the temperature of the piezoelectric body layer 12 was controlled to be 100° C., and DC voltage of 6 kV was applied between the thin film electrode 14 and the corona electrode 30 to cause corona discharge.

On the laminate 10b having undergone the polarization processing, the sheet-like substance 10c was laminated in a state where the thin film electrode 16 (thin copper film side) faced the piezoelectric body layer 12.

Then the laminate of the laminate 10b and the sheet-like substance 10c was subjected to thermocompression bonding at 120° C. by using a laminator apparatus, such that the piezoelectric body layer 12 was bonded to the thin film electrodes 14 and 16, whereby the converter film 10 was prepared.

[Flexibility Test]

From the prepared converter film 10, a 1 cm×15 cm strip specimen was prepared.

The specimen was bent to yield a predetermined radius of curvature (r=5 cm, r=2.5 cm, or r=0.5 cm) and allowed to recover their original state. This operation was repeated 10 times, and then the electric characteristics (capacitance and dielectric loss) and change in appearance were investigated.

When the specimen did not exhibit change in the electric characteristics nor appearance, it was marked with ○. When the specimen did not exhibit change in the electric characteristics but had a mark such as a crease, it was marked with Δ. When the specimen exhibited change in the electric characteristics, it was marked with X.

The results are shown in Table 1.

[Dynamic Viscoelasticity Test]

From the prepared converter film 10, a 1 cm×4 cm strip specimen was prepared.

The dynamic viscoelasticity (storage modulus E' (GPa) and loss tangent tan δ) of the specimen was measured by a dynamic viscoelasticity tester (DMS6100 viscoelasticity spectrometer manufactured by SII NanoTechnology Inc.). The measurement was performed under the following conditions.

Figure 13A:
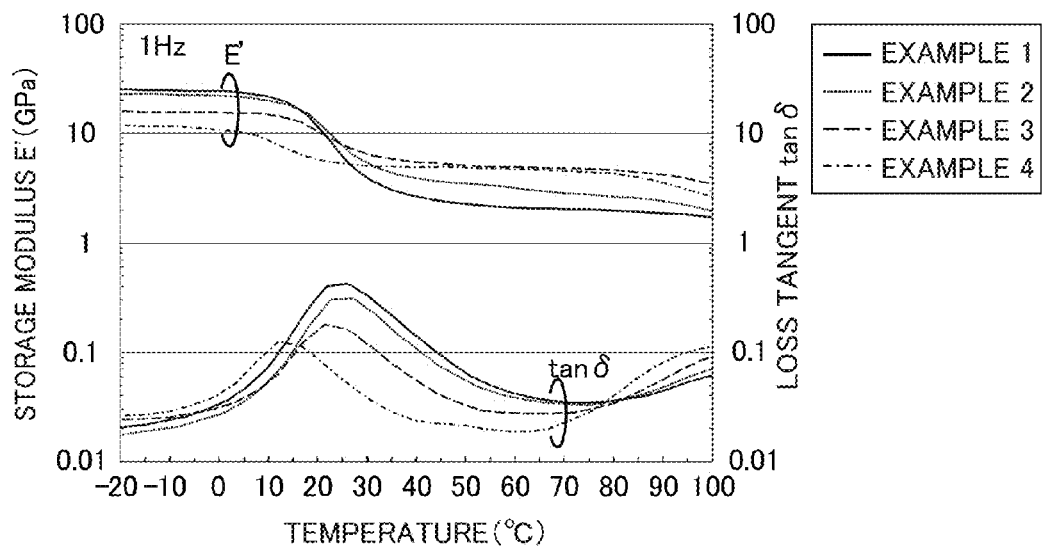
FIG. 13A is a diagram illustrating the influence of the thickness of the protective layers on the dynamic viscoelasticity of the electroacoustic converter film of the present invention.

Range of measurement temperatures: −20° C. to 100° C.
Rate of temperature increase: 2° C./min
Measurement frequency: 0.1 Hz, 0.2 Hz, 0.5 Hz, 1.0 Hz, 2.0 Hz, 5.0 Hz, 10 Hz, 20 Hz
Measurement mode: tensile measurement The temperature dependence of dynamic viscoelasticity is shown in FIG. 8A and Table 1. In addition, the results as obtained at 1 Hz are also shown in FIG. 13A.

Moreover, the master curves at a standard temperature of 25° C. that were obtained by dynamic viscoelasticity measurement are shown in FIG. 17.

Generally, between the frequency and the temperature in the results of the dynamic viscoelasticity measurement, a certain relationship exists based on "the time-temperature superposition principle." For example, it is possible to convert the change in temperature into the change in frequency to investigate frequency dispersion of viscoelastic characteristics at a certain temperature. The curve plotted at this time is called a master curve. It is impractical to perform viscoelasticity measurement in an actual audible frequency band, for example, at 1 kHz. Accordingly, at grasping storage modulus E' or loss tangent tan δ of a material in an audible frequency band, a master curve is effective.

The storage modulus E' and the loss tangent tan δ for each frequency that were obtained from the master curves at a standard temperature of 25° C. (FIG. 17) are set forth in Table 2.

Also set forth in Table 2 is the sonic velocity v for each frequency that was calculated by the following equation. In the equation, ρ is the specific gravity, and E is the Young's modulus (corresponding to the storage modulus E').

Sonic Velocity:

$$v = \sqrt{\frac{E}{\rho}}$$

Table 2 also contains the Young's modulus (corresponding to the storage modulus E'), the internal loss (corresponding to the loss tangent tan δ), the specific gravity and the sonic velocity of cone paper generally used for speakers.

In addition, the temperature dependence of the dynamic viscoelasticity of the cyanoethylated PVA alone, which was used for the matrix of the electroacoustic converter film, is shown in FIG. 9A.

[Speaker Performance Test]

From the prepared converter film 10, a circular specimen 150 mm in the diameter as denoted by φ was prepared.

By using this specimen, the piezoelectric speaker 56 illustrated in FIG. 5C was prepared. As the case 42, a circular container made of plastic and having an inner diameter of 138 mm and a depth of 9 mm was used. The pressure in the case 42 was maintained at 1.02 atm. In this manner, the converter film 10 was convexly bent just like contact lens.

The sound pressure level-frequency characteristics of the thin piezoelectric speaker prepared as above were measured by sine wave sweep measurement. A microphone for the measurement was placed at a distance of 10 cm right above the center of the piezoelectric speaker 56 (see FIG. 11).

Figure 10:
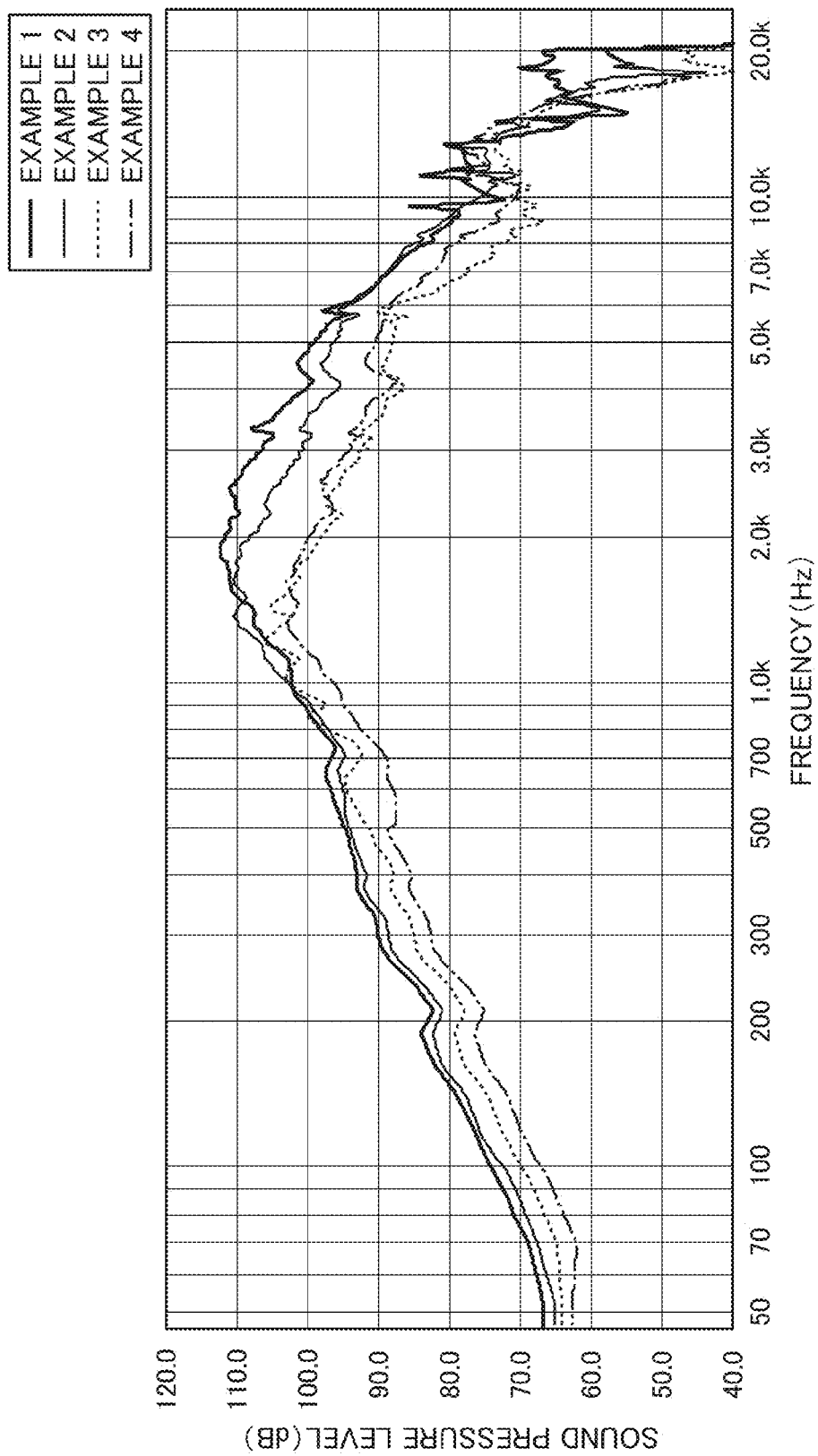
FIG. 10 is a diagram illustrating the influence of the thickness of the protective layers on the speaker performance of the electroacoustic converter film of the present invention.

The measurement results of the sound pressure level-frequency characteristics are shown in FIG. 10.

[Flexible Speaker Performance Test Conducted while Varying Radius of Curvature]

A 200 mm×150 mm rectangular specimen was prepared from the prepared converter film 10.

To the specimen, a PET film having a thickness of 80 μm was laminated on the assumption that the film was a flexible display.

Figure 11:
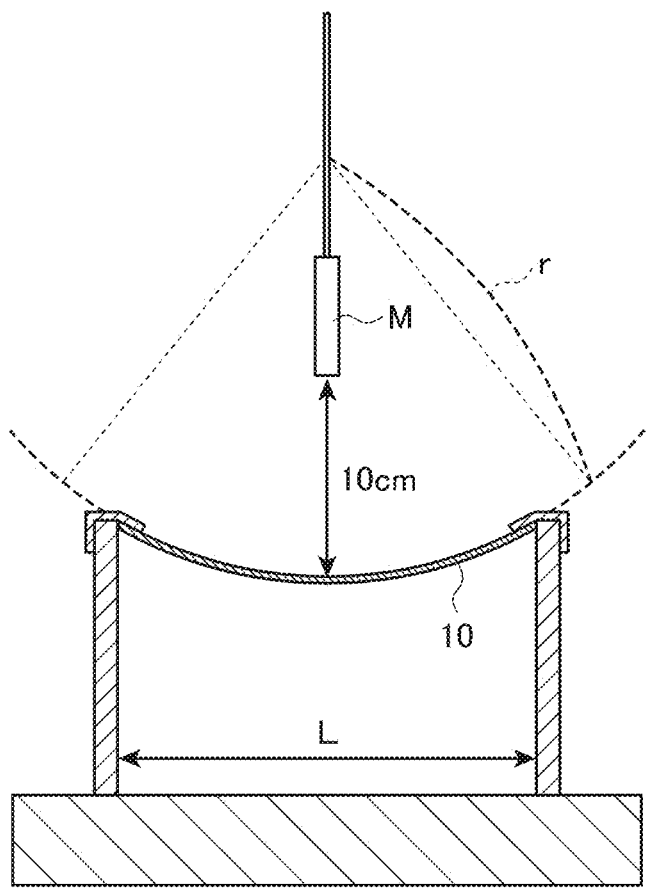
FIG. 11 is a view illustrating how to evaluate the flexible speaker performance by varying the radius of curvature.

As illustrated in FIG. 11, the resultant laminate was suspended between two plastic stands adjustable in distance L therebetween. That is, by moving the stands to different positions, the radius of curvature r of the converter film 10 can be varied. A microphone M for measurement was placed at a distance of 10 cm right above the center of the converter film 10.

Under the above conditions, in a state where the radius of curvature r of the converter film 10 was maintained as desired, the sound pressure level-frequency characteristics of the converter film 10 as a flexible speaker were measured by sine wave sweep measurement. The radius of curvature r of the converter film 10 was set at three values, namely, 20 cm, 30 cm and 40 cm. Moreover, the measurement was performed twice for a case where the converter film 10 was bent in the longitudinal direction (X direction) and for a case where the converter film 10 was bent in the lateral direction (Y direction).

Figure 12A:
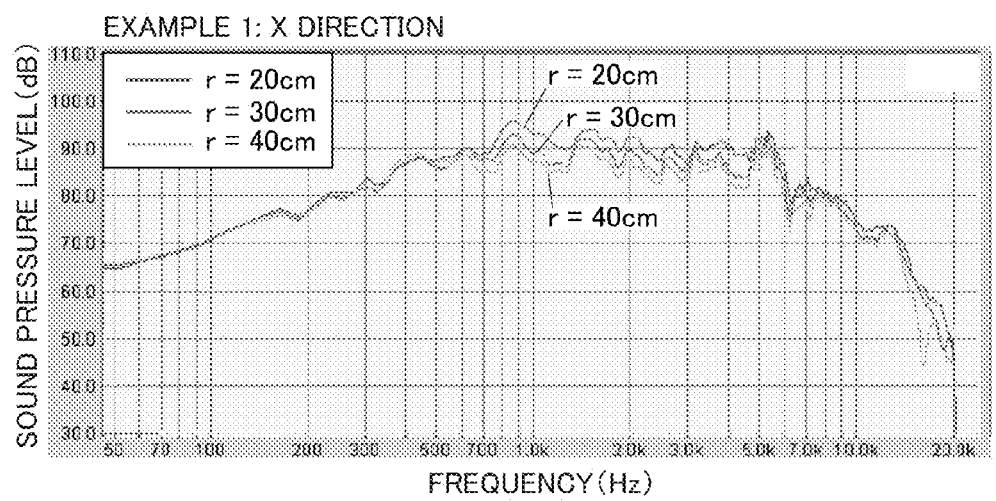
FIGS. 12A and 12B are diagrams illustrating the flexible speaker performance of the electroacoustic converter film of the present invention as varied in radius of curvature.
Figure 12B:
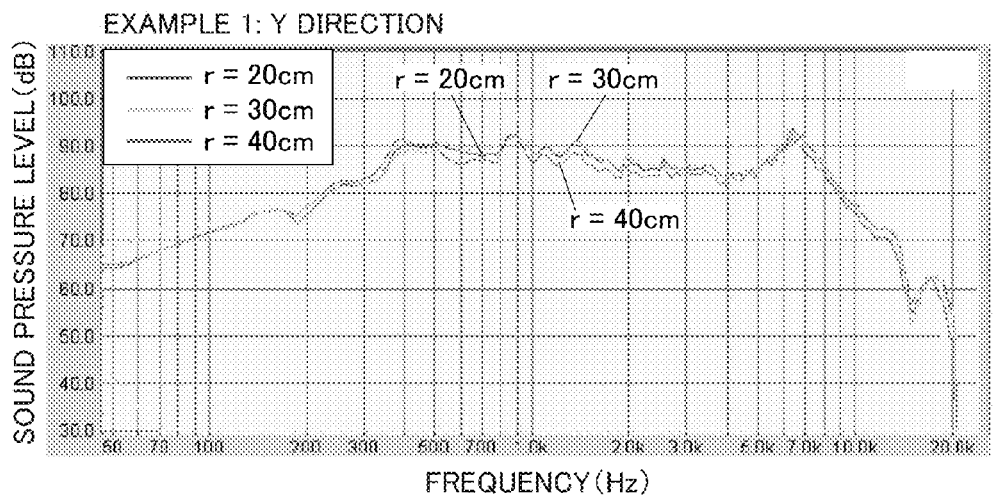

The measurement results of the sound pressure level-frequency characteristics that were obtained by varying the radius of curvature are shown in FIG. 12. FIG. 12A shows the results as obtained during the bending in the X direction, and FIG. 12B shows the results as obtained during the bending in the Y direction.

Example 2

The converter film 10 was prepared in the completely same manner as in Example 1, except that the sheet-like substances 10a and 10c as used were each obtained by vacuum-depositing a thin copper film having a thickness of 0.1 μm onto a PET film having a thickness of 12 μm.

That is, in this example, the thin film electrodes 14 and 16 are each composed of the deposited thin copper film having a thickness of 0.1 μm, and the protective layers 18 and 20 are each composed of the PET film having a thickness of 12 μm. The thickness of the piezoelectric body layer 12 was 45 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13A and Table 1, and the measurement results of the sound pressure level-frequency characteristics are shown in FIG. 10.

Example 3

The converter film 10 was prepared in the completely same manner as in Example 1, except that the sheet-like substances 10a and 10c as used were each obtained by vacuum-depositing a thin copper film having a thickness of 0.1 μm onto a PET film having a thickness of 25 μm. That is, in this example, the thin film electrodes 14 and 16 are each composed of the deposited thin copper film having a thickness of 0.1 μm, and the protective layers 18 and 20 are each composed of the PET film having a thickness of 25 μm.

Regarding the converter film 10 prepared in this manner, the flexibility test, dynamic viscoelasticity test and speaker performance test were performed in the same manner as in Example 1.

Figure 13B:
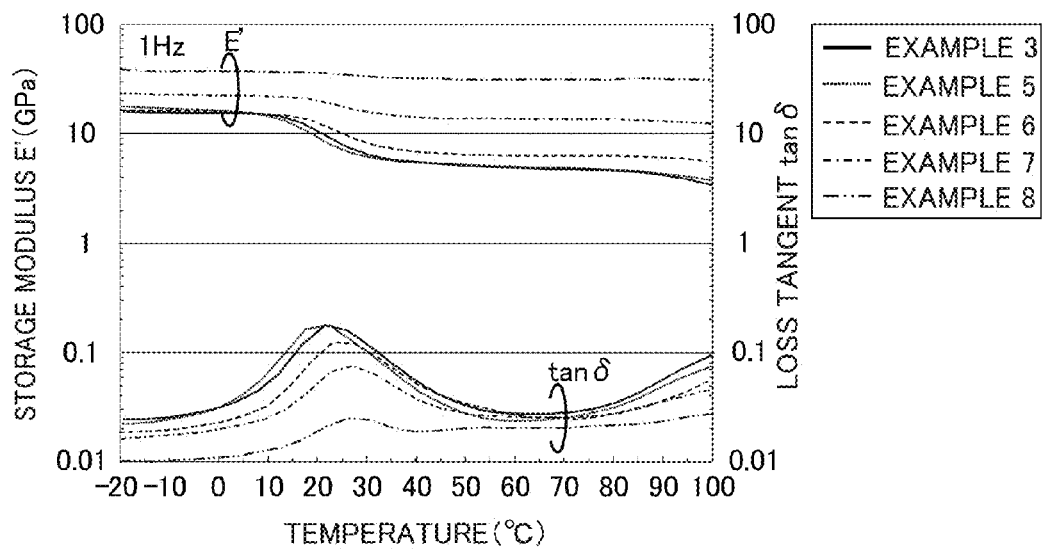
FIG. 13B is a diagram illustrating the influence of the thickness of the thin film electrodes on the dynamic viscoelasticity of the electroacoustic converter film of the present invention.
Figure 14:
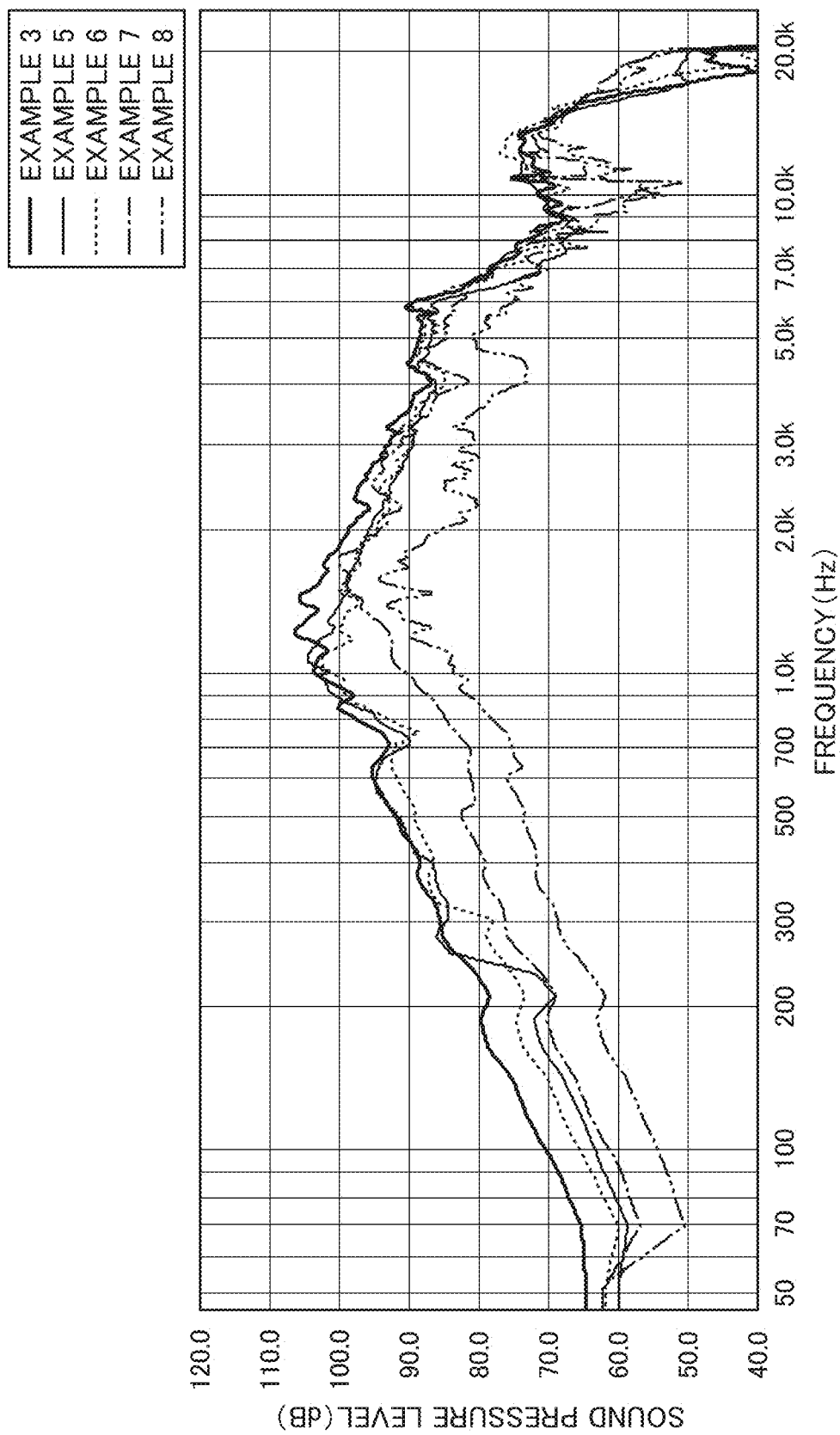
FIG. 14 is a diagram illustrating the influence of the thickness of the thin film electrodes on the speaker performance of the electroacoustic converter film of the present invention.

The results of the flexibility test are shown in Table 1, the temperature dependence of the dynamic viscoelasticity at 1 Hz is shown in FIG. 13A and Table 1, and the measurement results of the sound pressure level-frequency characteristics are shown in FIG. 10. The temperature dependence of the dynamic viscoelasticity is also shown in FIG. 13B, and the sound pressure level-frequency characteristics are also shown in FIG. 14.

Example 4

The converter film 10 was prepared in the completely same manner as in Example 1, except that the sheet-like substances 10a and 10c as used were each obtained by vacuum-depositing a thin copper film having a thickness of 0.1 μm onto a PET film having a thickness of 50 μm. That is, in this example, the thin film electrodes 14 and 16 are each composed of the deposited thin copper film having a thickness of 0.1 μm, and the protective layers 18 and 20 are each composed of the PET film having a thickness of 50 μm. The thickness of the piezoelectric body layer 12 was 42 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13A and Table 1, and the measurement results of the sound pressure level-frequency characteristics are shown in FIG. 10.

Example 5

The converter film 10 was prepared in the completely same manner as in Example 1, except that the sheet-like substances 10a and 10c as used were each obtained by vacuum-depositing a thin copper film having a thickness of 0.3 μm onto a PET film having a thickness of 25 μm. That is, in this example, the thin film electrodes 14 and 16 are each composed of the deposited thin copper film having a thickness of 0.3 μm, and the protective layers 18 and 20 are each composed of the PET film having a thickness of 25 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13B and Table 1, and the measurement results of the sound pressure level-frequency characteristics are shown in FIG. 14.

Example 6

The converter film 10 was prepared in the completely same manner as in Example 1, except that the sheet-like substances 10a and 10c as used were each obtained by vacuum-depositing a thin copper film having a thickness of 1.0 μm onto a PET film having a thickness of 25 μm. That is, in this example, the thin film electrodes 14 and 16 are each composed of the deposited thin copper film having a thickness of 1.0 μm, and the protective layers 18 and 20 are each composed of a PET film having a thickness of 25 μm. The thickness of the piezoelectric body layer 12 was 41 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13B and Table 1, and the measurement results of the sound pressure level-frequency characteristics are shown in FIG. 14.

Example 7

The converter film 10 was prepared in the completely same manner as in Example 1, except that the sheet-like substances 10a and 10c as used were each obtained by forming a thin copper film having a thickness of 3.0 μm on a PET film having a thickness of 25 μm by means of plating. That is, in this example, the thin film electrodes 14 and 16 are each composed of a copper plating film having a thickness of 3.0 μm, and the protective layers 18 and 20 are each composed of the PET film having a thickness of 25 μm. The thickness of the piezoelectric body layer 12 was 44 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13B and Table 1, and the measurement results of the sound pressure level-frequency characteristics are shown in FIG. 14.

Example 8

The converter film 10 was prepared in the completely same manner as in Example 1, except that the sheet-like substances 10a and 10c as used were each obtained by forming a thin copper film having a thickness of 10.0 μm on a PET film having a thickness of 25 μm by means of plating. That is, in this example, the thin film electrodes 14 and 16 are each composed of a copper plating film having a thickness of 10.0 μm, and the protective layers 18 and 20 are each composed of the PET film having a thickness of 25 μm. The thickness of the piezoelectric body layer 12 was 50 μm.

Regarding the converter film 10 prepared in this manner, the flexibility test, dynamic viscoelasticity test and speaker performance test were performed in the same manner as in Example 1.

The results of the flexibility test are shown in Table 1, the temperature dependence of the dynamic viscoelasticity at 1 Hz is shown in FIG. 13B and Table 1, and the measurement results of the sound pressure level-frequency characteristics are shown in FIG. 14.

Comparative Example 1

An electroacoustic converter film was prepared in the same manner as in Example 1, except that cyanoethylated pullulan not exhibiting viscoelasticity at ordinary temperatures was used as a polymer matrix. That is, in this example, the thin film electrodes 14 and 16 are each composed of the deposited thin copper film having a thickness of 0.1 μm, and the protective layers 18 and 20 are each composed of the PET film having a thickness of 4 μm. The thickness of the piezoelectric body layer was 42 μm.

Regarding the electroacoustic converter film prepared in this manner, the flexibility test, dynamic viscoelasticity test, and flexible speaker performance test conducted while varying the radius of curvature were performed in the same manner as in Example 1.

The results of the flexibility test are shown in Table 1, and the temperature dependence of the dynamic viscoelasticity is shown in FIG. 8B and Table 1.

Unlike in Example 1, in Comparative Example 1, frequency dispersion was practically not observed in the storage modulus E' around ordinary temperatures. Therefore, the storage modulus E' and the loss tangent tan δ at 25° C. and 20 Hz are set forth as representative values in Table 2, and the sonic velocity v was calculated from the specific gravity and the storage modulus E'.

Figure 15A:
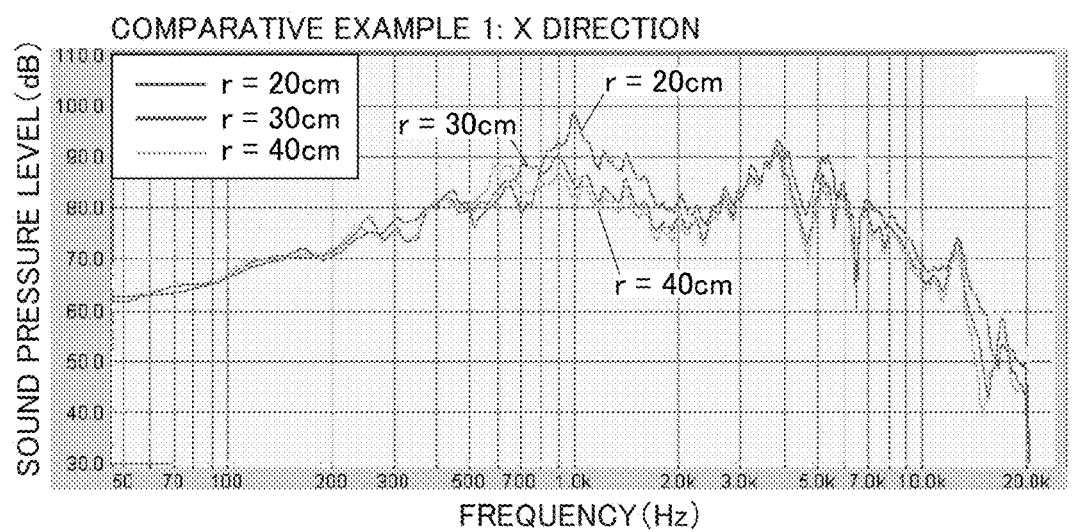
FIGS. 15A and 15B are diagrams illustrating the flexible speaker performance of a comparative material as varied in radius of curvature.
Figure 15B:
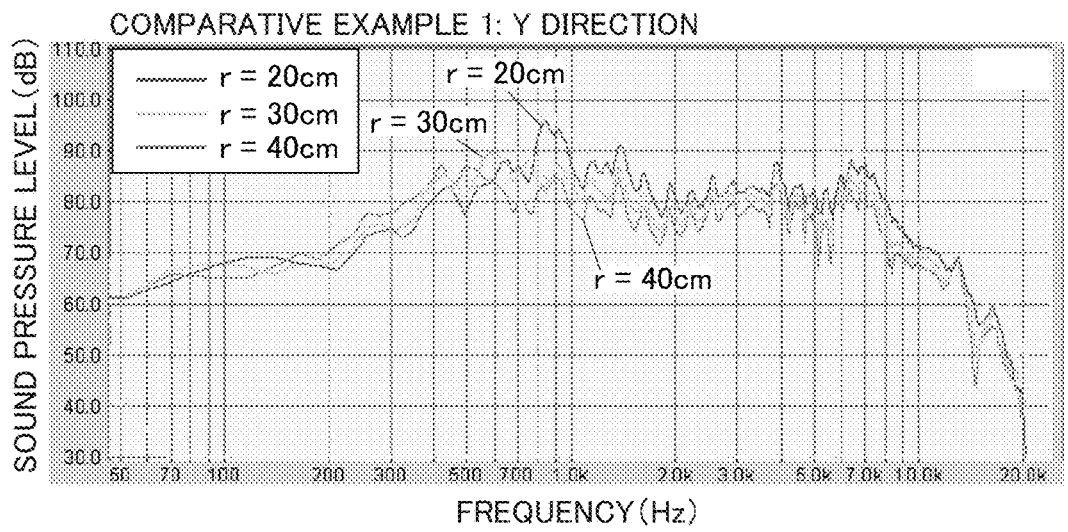

Moreover, FIG. 15 shows the measurement results of the sound pressure level-frequency characteristics that were obtained by varying the radius of curvature in the same manner as in Example 1. FIG. 15A shows the results as obtained during the bending in the X direction (longitudinal direction), and FIG. 15B shows the results as obtained during the bending in the Y direction (lateral direction).

In addition, FIG. 9B shows the temperature dependence of the dynamic viscoelasticity of the cyanoethylated pullulan alone, which was used as the matrix of the electroacoustic converter film.

Comparative Example 2

A piezoelectric film formed of PVDF and having a thickness of 56 µm was prepared.

A thin copper film having a thickness of 0.1 µm was formed by vapor deposition on each side of the piezoelectric film to prepare an electroacoustic converter film.

Regarding the electroacoustic converter film prepared in this manner, the flexibility test, dynamic viscoelasticity test, and flexible speaker performance test conducted while varying the radius of curvature were performed in the same manner as in Example 1. When a 20 cm×15 cm rectangular specimen was prepared for the flexible speaker performance test, the longitudinal direction was made parallel with the polarization direction (stretch direction).

The results of the flexibility test are shown in Table 1, and the temperature dependence of the dynamic viscoelasticity is shown in FIG. 8C and Table 1.

Unlike in Example 1, also in Comparative Example 2, frequency dispersion was practically not observed in the storage modulus E' around ordinary temperatures. Therefore, the storage modulus E' and the loss tangent tan δ at 25° C. and 20 Hz are set forth as representative values in Table 2, and the sonic velocity v was calculated from the specific gravity and the storage modulus E'.

Figure 16A:
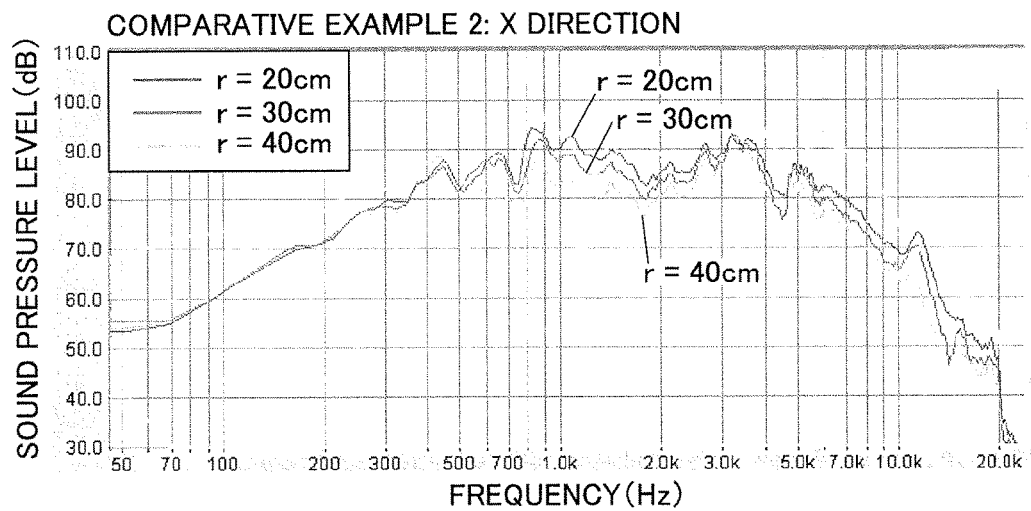
FIGS. 16A and 16B are diagrams illustrating the flexible speaker performance of another comparative material as varied in radius of curvature.
Figure 16B:
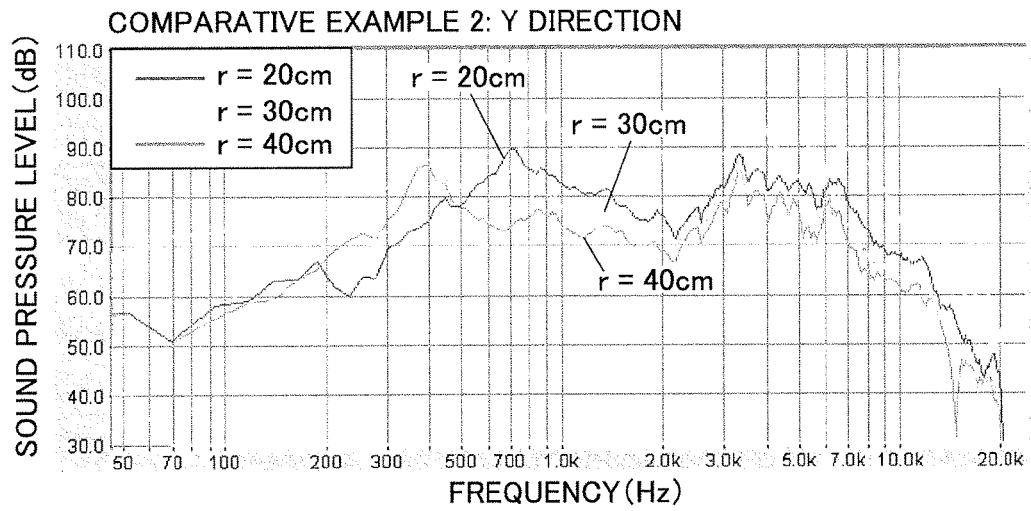

Moreover, FIG. 16 shows the measurement results of the sound pressure level-frequency characteristics that were obtained by varying the radius of curvature in the same manner as in Example 1. FIG. 16A shows the results as obtained during the bending in the X direction (longitudinal direction), and FIG. 16B shows the results as obtained during the bending in the Y direction (lateral direction).

TABLE 1

| | | Polymeric composite piezoelectric body | | | | | | | | Comparative Example 1 | PVDF Comparative Example 2 |
|---|---|---|---|---|---|---|---|---|---|---|---|
| | | Example 1 | Example 2 | Example 3 | Example 4 | Example 5 | Example 6 | Example 7 | Example 8 | | |
| Thickness (µm) | Piezoelectric layer | 40 | 45 | 40 | 42 | 40 | 41 | 44 | 50 | 42 | 56 |
| | Protective layer | 4 | 12 | 25 | 50 | 25 | 25 | 25 | 25 | 4 | None |
| | Electrode layer | 0.1 | 0.1 | 0.1 | 0.1 | 0.3 | 1 | 3 | 10 | 0.1 | 0.1 |
| | Total | 48 | 69 | 90 | 142 | 91 | 93 | 100 | 120 | 50 | 56 |
| Flexibility | Φ10 cm | ○ | ○ | ○ | ○ | ○ | ○ | ○ | ○ | ○ | ○ |
| | Φ3 cm | ○ | ○ | ○ | ○ | ○ | ○ | ○ | Δ | X | ○ |
| | Φ1 cm | ○ | ○ | ○ | Δ | ○ | ○ | Δ | X | X | ○ |
| Loss tangent | 1 Hz, 0° C. | 0.036 | 0.028 | 0.030 | 0.039 | 0.032 | 0.023 | 0.020 | 0.011 | 0.035 | 0.017 |
| | 1 Hz, 25° C. | 0.430 | 0.307 | 0.160 | 0.050 | 0.130 | 0.125 | 0.075 | 0.025 | 0.038 | 0.017 |
| | 1 Hz, 50° C. | 0.061 | 0.050 | 0.034 | 0.022 | 0.028 | 0.034 | 0.028 | 0.020 | 0.045 | 0.024 |
| Storage modulus (GPa) | 1 Hz, 0° C. | 24.1 | 21.9 | 15.6 | 11.0 | 16.4 | 15.9 | 22.5 | 37.2 | 13.8 | 5.1 |
| | 1 Hz, 25° C. | 5.5 | 6.4 | 7.4 | 5.3 | 6.6 | 11.1 | 16.7 | 34.5 | 12.3 | 4.6 |
| | 1 Hz, 50° C. | 2.2 | 3.4 | 5.2 | 4.9 | 5.2 | 6.5 | 13.8 | 31.6 | 10.9 | 3.8 |
| Thickness × storage modulus (N/m) | 1 Hz, 0° C. | 1.2E+06 | 1.5E+06 | 1.4E+06 | 1.6E+06 | 1.5E+06 | 1.5E+06 | 2.2E+06 | 4.5E+06 | 6.9E+05 | 2.6E+05 |
| | 1 Hz, 25° C. | 2.6E+05 | 4.4E+05 | 6.7E+05 | 7.5E+05 | 6.0E+05 | 1.0E+06 | 1.7E+06 | 4.1E+06 | 6.1E+05 | 2.3E+05 |
| | 1 Hz, 50° C. | 1.1E+05 | 2.4E+05 | 4.7E+05 | 6.9E+05 | 4.7E+05 | 6.0E+05 | 1.4E+06 | 3.8E+06 | 5.5E+05 | 1.9E+05 |

TABLE 2

| | Cone paper | Example 1 | | | | | | | | | Comparative Example 1 | Comparative Example 2 |
|---|---|---|---|---|---|---|---|---|---|---|---|---|
| | | 0.01 Hz | 0.1 Hz | 1 Hz | 10 Hz | 100 Hz | 1 kHz | 10 kHz | 100 kHz | 1 MHz | | |
| Storage modulus (GPa) | 1.45 | 3.2 | 4.0 | 5.5 | 11.2 | 16.1 | 18.8 | 20.7 | 21.8 | 22.1 | 12.8 | 5 |

TABLE 2-continued

| | Cone paper | Example 1 | | | | | | | | | Comparative Example 1 | Comparative Example 2 |
| | | 0.01 Hz | 0.1 Hz | 1 Hz | 10 Hz | 100 Hz | 1 kHz | 10 kHz | 100 kHz | 1 MHz | | |
|---|---|---|---|---|---|---|---|---|---|---|---|---|
| Specific gravity (g/cm$^3$) | 0.4 | 4.6 | 4.6 | 4.6 | 4.6 | 4.6 | 4.6 | 4.6 | 4.6 | 4.6 | 4.6 | 1.8 |
| Sonic velocity (m/sec) | 1904 | 834 | 933 | 1093 | 1560 | 1871 | 2022 | 2121 | 2177 | 2192 | 1668 | 1667 |
| Loss tangent | 0.035 | 0.256 | 0.339 | 0.430 | 0.352 | 0.206 | 0.139 | 0.086 | 0.074 | 0.069 | 0.034 | 0.018 |

From Table 1, it is understood that Examples 1 to 8, which use cyanoethylated PVA exhibiting viscoelasticity at ordinary temperatures as a matrix, have flexibility extremely superior to that of Comparative Example 1 which uses cyanoethylated pullulan not exhibiting viscoelasticity at ordinary temperatures as a matrix. However, if the electrode layer is too thick, the flexibility greatly deteriorates.

From Table 1, it is also understood that if a product of the thickness of the converter film 10 and the storage modulus (E') at a frequency of 1 Hz of the converter film 10 that is obtained by dynamic viscoelasticity measurement is 1.0×10$^6$ N/m to 2.0×10$^6$ N/m at 0° C. and 1.0×10$^5$ N/m to 1.0×10$^6$ N/m at 50° C., appropriate rigidity and mechanical strength are obtained within ranges not impairing the flexibility.

Moreover, in FIG. 13, as the thickness of the protective layer and the electrode increases, the value of the storage modulus (E') of the converter film 10 becomes closer to the elastic modulus of the protective layer and the electrode, and the value of the loss tangent (tan δ) decreases. From this fact, it is understood that the viscoelasticity characteristics of the converter film 10 are mainly influenced by the protective layer and the electrode.

That is, it is considered that the reason why the sound pressure level decreases as the thickness of the protective layer and the electrode increases in FIGS. 10 and 14 is that the expansion and contraction of the converter film 10 are decreased by the restriction due to the protective layer and the electrode.

The above fact shows that it is preferable that the protective layer and the electrode in the converter film 10 of the present invention be adjusted in material and thickness according to the requirements for the energy efficiency, flexibility and mechanical strength, which will vary with the use.

Meanwhile, from FIG. 12, it is understood that the converter film 10 of the present invention has flat frequency characteristics and only causes a small degree of change in the sound quality with respect to the change in the radius of curvature, with essentially no difference between changes in the X direction and the Y direction. That is, as seen from Table 2, at a frequency within an audible frequency band from 20 Hz to 20 kHz, the converter film 10 of the present invention has a loss tangent comparable to or higher than that of cone paper. It is understood that for this reason, the frequency characteristics of the speaker easily become smooth, and accordingly, the degree of the change in sound quality that is caused when the lowest resonance frequency $f_0$ varies with the change in curvature is also reduced. It is also understood that since the converter film 10 does not exhibit in-plane anisotropy in its piezoelectric characteristics, the same sound quality can practically be obtained irrespective of whether the converter film 10 is bent in the X direction or the Y direction.

In contrast, the Comparative Examples 1 and 2, in which the sound quality varies with the change in curvature as shown in FIGS. 15 and 16, have a loss tangent smaller than that of cone paper as seen from Table 2. Accordingly, Comparative Examples 1 and 2 prone to cause strong resonance and have frequency characteristics showing great fluctuation. Therefore, when the lowest resonance frequency $f_0$ varies with the change in curvature, the sound quality changes to a high degree. Moreover, it is understood that since Comparative Example 2 (PVDF) exhibits in-plane anisotropy in the piezoelectric characteristics, the degree of change in sound quality greatly differs between the X and Y directions.

That is, the converter film 10 of the present invention has extremely excellent flexibility and, when used as a flexible speaker, is capable of outputting constant sound quality regardless of the bending method or the like depending on the situation in which the film is used. On the other hand, PVDF of Comparative Example 2 has excellent flexibility indeed, but greatly varies in sound quality with the bending direction or the curvature as shown in FIG. 16. Accordingly, it is not suitable for the use as a flexible speaker.

Moreover, it is also understood from Table 2 that the converter film 10 of the present invention has characteristics in which the sonic velocity is comparable to or higher than that of cone paper at a frequency within an audible frequency band from 20 Hz to 20 kHz, and as the frequency becomes higher, the sonic velocity increases. Therefore, since the entire diaphragm can integrally reproduce sound even in upper register, the converter film of the invention is advantageous in view of broadening the frequency band of high-pitched tones.

Example 9

The converter film 10 was prepared in the same manner as in Example 1.

That is, in this example, the thin film electrodes 14 and 16 are each composed of the deposited thin copper film having a thickness of 0.1 μm, and the protective layer 18 and 20 are each composed of the PET film having a thickness of 4 μm.

By using the prepared converter film 10, the piezoelectric speaker 40 shown in FIGS. 3A and 3B was prepared.

The size of the case 42 and the frame 48, that is, the size of the face generating sound was 210 mm×300 mm (A4 size). The depth of the case 42 was set at 9 mm.

As the viscoelastic support 46, a glass wool material having a thickness of 25 mm and a density of 32 kg/m$^3$ was prepared and cut according to the dimensions of the case 42. Likewise, the converter film 10 was also cut according to the dimensions of the case 42.

The viscoelastic support 46 was placed in the case 42, and the converter film 10 was so provided as to cover the case 42 and the viscoelastic support 46. Then, the frame 48 was put on the converter film 10 and as such fixed to the case 42 so as to prepare the piezoelectric speaker 40.

Voltage from a driving amplifier was applied to the converter film 10 of the piezoelectric speaker 40 prepared as above, and the relationship between the sound pressure level and the frequency of the sound generated at this time (frequency characteristics) was measured.

Figure 18:
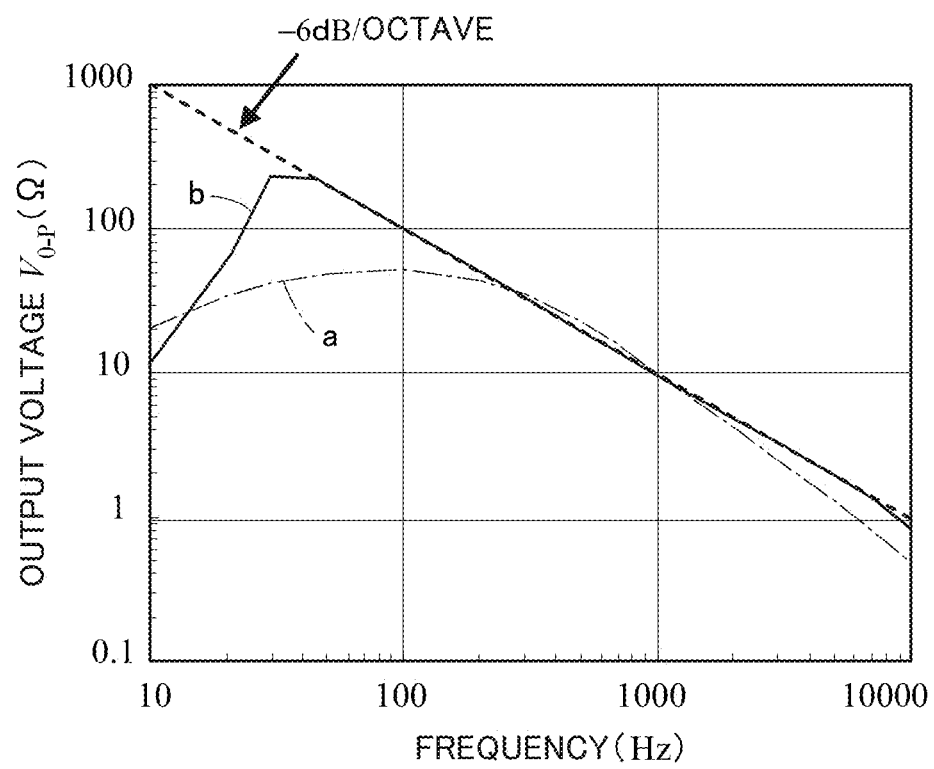
FIG. 18 is a diagram illustrating output voltage characteristics of a driving amplifier during the measurement of the speaker performance of a piezoelectric speaker using the electroacoustic converter film of the present invention.

The output voltage from the driving amplifier was made to have the characteristics indicated by chain line a in FIG. 18 and the characteristics indicated by solid line b in FIG. 18. With the output voltage characteristics indicated by solid line b, the output voltage approximated to −6/octave (broken line).

Figure 19A:
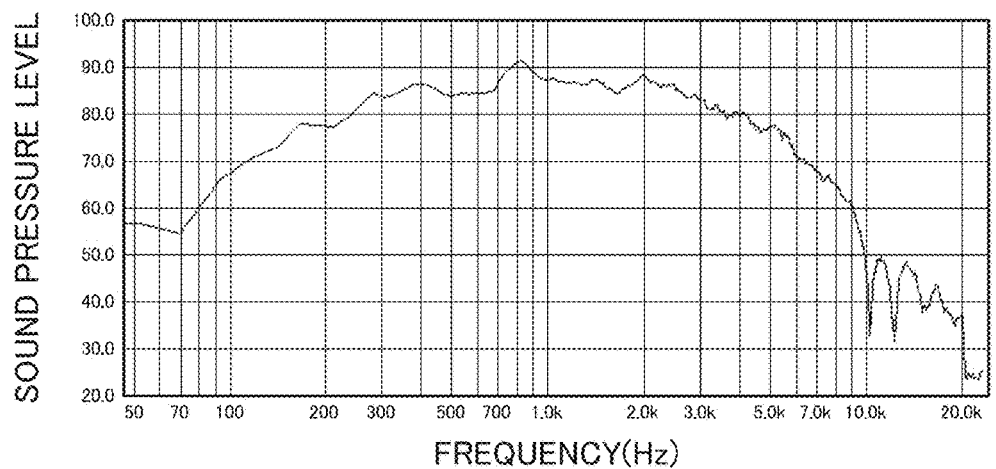
FIGS. 19A and 19B are diagrams illustrating frequency characteristics of another example of the piezoelectric speaker using the electroacoustic converter film of the present invention.
Figure 19B:
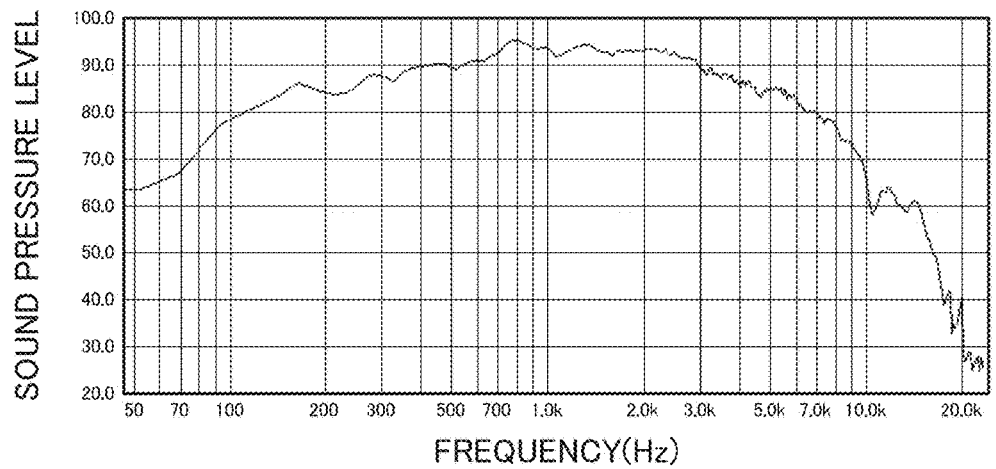

FIG. 19A shows the sound pressure level-frequency characteristics of the piezoelectric speaker 40 when the output voltage characteristics were those indicated by chain line a, and FIG. 19B shows the sound pressure level-frequency characteristics of the piezoelectric speaker 40 when the output voltage characteristics were those indicated by solid line b.

From FIG. 19, it is understood that the piezoelectric speaker using the converter film 10 of the present invention achieves a sufficiently high sound pressure level at any frequency and can realize smooth frequency characteristics over a broad band. It is also understood that if the driving amplifier is combined with a constant current circuit, the frequency band can be further broadened.

Example 10

A 30 mm×30 mm piece was cut out of the converter film 10 prepared in Example 1, and lead wires for taking out electric signals were connected to the thin film electrodes 14 and 16, thereby preparing the musical instrument sensor of the present invention. The converter film 10 of the musical instrument sensor was adhered to the surface of a commercially available acoustic guitar by using a double-sided tape.

Figure 20B:
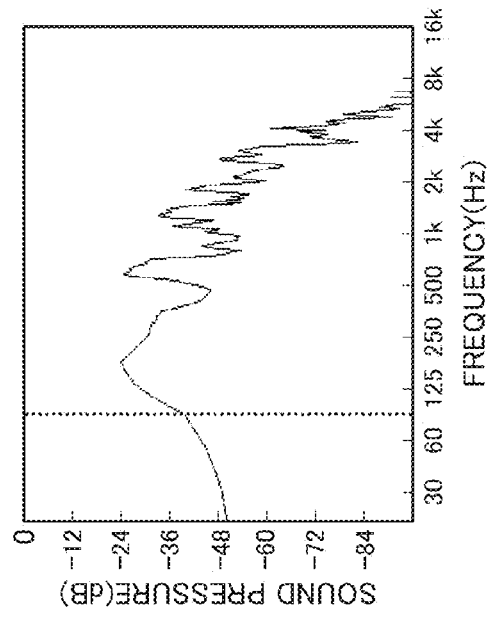
FIGS. 20B to 20D are diagrams each illustrating sound pressure-to-frequency characteristics of a conventional musical instrument sensor.
Figure 20D:
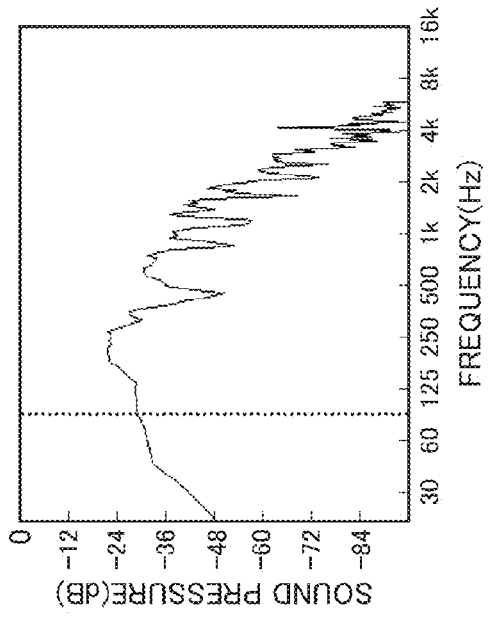
Figure 20A:
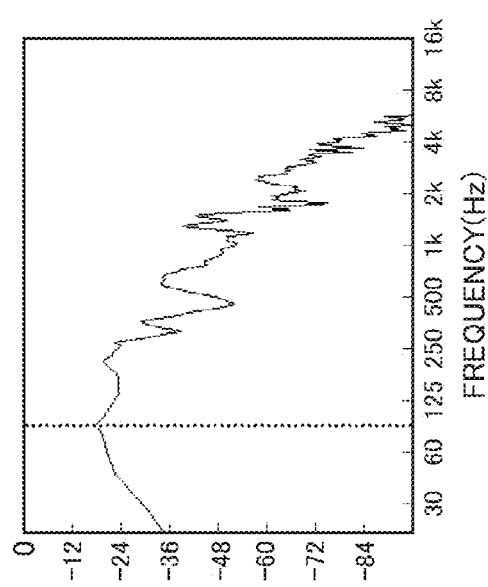
FIG. 20A is a diagram illustrating frequency characteristics of the musical instrument sensor of the present invention.

The sound pressure level-frequency characteristics of the musical instrument sensor as prepared are shown in FIG. 20A.

Figure 20C:
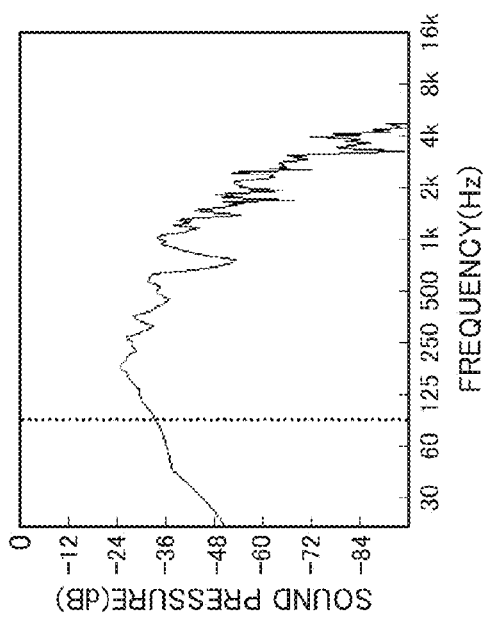

For reference, FIG. 20B shows the sound pressure level-frequency characteristics observed when A1-OSJ manufactured by ARTEC Corporation is mounted on the same acoustic guitar, FIG. 20C shows the sound pressure level-frequency characteristics observed when CP3 manufactured by MORRIS Corporation is mounted on the same guitar, and FIG. 20D shows the sound pressure level-frequency characteristics observed when iBeam manufactured by LR Baggs Corporation is mounted on the same guitar.

From FIG. 20A, it is understood that compared to commercially available pickups (FIGS. 20B to 20D), the musical instrument sensor of the present invention shows satisfactory output performance even in a lower register around 82 Hz (broken lines in the figures) which is the basic frequency of the 6th string, and has superior pickup performance.

The above results clearly show the effects of the present invention.

What is claimed is:

1. An electroacoustic converter film, comprising: a polymeric composite piezoelectric body having piezoelectric particles dispersed in a viscoelastic matrix which is formed of a polymer material exhibiting viscoelasticity at ordinary temperatures; thin film electrodes formed on both sides of the polymeric composite piezoelectric body; and protective layers formed on surfaces of the thin film electrodes, wherein the polymeric composite piezoelectric body is subjected to polarization processing, the polymer material has a glass transition temperature of 0° C. to 50° C. at a frequency of 1 Hz, and the polymer material has a cyanoethyl group.

2. The electroacoustic converter film according to claim 1, wherein a loss tangent (tan δ) at a frequency of 1 Hz obtained by dynamic viscoelasticity measurement of the electroacoustic converter film has a local maximum of 0.1 or more within a temperature range of 0° C. to 50° C.

3. The electroacoustic converter film according to claim 1, wherein a storage modulus (E') at a frequency of 1 Hz obtained by dynamic viscoelasticity measurement of the electroacoustic converter film is 10 to 30 GPa at 0° C. and 1 to 10 GPa at 50° C.

4. The electroacoustic converter film according to claim 1, wherein a product of a thickness of the electroacoustic converter film and a storage modulus (E') at a frequency of 1 Hz obtained by dynamic viscoelasticity measurement of the electroacoustic converter film is $1.0 \times 10^6$ N/m to $2.0 \times 10^6$ N/m at 0° C. and $1.0 \times 10^5$ N/m to $1.0 \times 10^6$ N/m at 50° C.

5. The electroacoustic converter film according to claim 1, wherein, on a master curve obtained from dynamic viscoelasticity measurement of the electroacoustic converter film, a loss tangent (tan δ) at 25° C. and at a frequency of 1 kHz is 0.05 or more.

6. The electroacoustic converter film according to claim 1, wherein a loss tangent (tan δ) at a frequency of 1 Hz obtained by dynamic viscoelasticity measurement of the polymer material has a local maximum of 0.5 or more within a temperature range of 0° C. to 50° C.

7. The electroacoustic converter film according to claim 1, wherein a storage modulus (E') at a frequency of 1 Hz obtained by dynamic viscoelasticity measurement of the polymer material is 100 MPa or higher at 0° C. and 10 MPa or lower at 50° C.

8. The electroacoustic converter film according to claim 1, wherein the polymer material has a relative dielectric constant of 10 or more at 25° C.

9. The electroacoustic converter film according to claim 1, wherein the polymer material is cyanoethylated polyvinyl alcohol.

10. The electroacoustic converter film according to claim 1, wherein the piezoelectric particles are present in the polymeric composite piezoelectric body at a volume fraction of 50% or higher.

11. The electroacoustic converter film according to claim 1, wherein the piezoelectric particles are ceramic particles having a perovskite crystal structure or a wurtzite crystal structure.

12. The electroacoustic converter film according to claim 11, wherein the ceramic particles are particles of lead zirconate titanate, lead lanthanate zirconate titanate, barium titanate, zinc oxide, or a solid solution of barium titanate and bismuth ferrite.

13. The electroacoustic converter film according to claim 1, wherein the protective layers have a thickness at most two times as large as a thickness of the polymeric composite piezoelectric body.

14. The electroacoustic converter film according to claim 1, wherein a product of a thickness and a Young's modulus of the thin film electrodes is smaller than a product of a thickness and a Young's modulus of the protective layers.

15. The electroacoustic converter film according to claim 1, wherein the protective layers are formed of polyethylene terephthalate, polypropylene, polystyrene, polycarbonate, polyphenylene sulfite, polymethyl methacrylate, polyetherimide, polyimide, polyethylene naphthalate, or a cyclic olefin resin.

16. The electroacoustic converter film according to claim 1, wherein the thin film electrodes are formed of copper, aluminum, gold, silver, platinum, or indium tin oxide.

17. A flexible display, comprising the electroacoustic converter film according to claim 1 that is attached to the flexible display exhibiting flexibility on a side opposite with a side where an image display surface is located.

18. A vocal cord microphone, which uses the electroacoustic converter film according to claim 1 as a sensor.

19. A musical instrument sensor, which uses the electroacoustic converter film according to claim 1 as a sensor.

* * * * *